United States Patent
Uchida et al.

(10) Patent No.: US 8,559,219 B2
(45) Date of Patent: Oct. 15, 2013

(54) STORAGE ELEMENT AND MEMORY DEVICE

(75) Inventors: Hiroyuki Uchida, Kanagawa (JP); Masanori Hosomi, Tokyo (JP); Kazuhiro Bessho, Kanagawa (JP); Hiroyuki Ohmori, Kanagawa (JP); Yutaka Higo, Kanagawa (JP); Tetsuya Asayama, Tokyo (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 112 days.

(21) Appl. No.: 13/344,024

(22) Filed: Jan. 5, 2012

(65) Prior Publication Data

US 2012/0182796 A1 Jul. 19, 2012

(30) Foreign Application Priority Data

Jan. 18, 2011 (JP) ................. 2011-007666

(51) Int. Cl.
*G11C 11/14* (2006.01)

(52) U.S. Cl.
USPC ...................................................... 365/171

(58) Field of Classification Search
USPC ...................................................... 365/171
See application file for complete search history.

(56) References Cited

U.S. PATENT DOCUMENTS

| | | | |
|---|---|---|---|
| 6,104,632 A * | 8/2000 | Nishimura | 365/158 |
| 6,256,223 B1 | 7/2001 | Sun | |
| 7,660,153 B2 | 2/2010 | Yamane et al. | |
| 7,869,272 B2 | 1/2011 | Yamane et al. | |

FOREIGN PATENT DOCUMENTS

| | | |
|---|---|---|
| JP | 2003-017782 | 1/2003 |
| JP | 2008-227388 | 9/2008 |

OTHER PUBLICATIONS

F. J. Albert et al.; Spin-polarized current switching of a Co thin film nanomagnet; Applied Physics Letters; vol. 77, No. 23; Dec. 4, 2000.
J. C. Slonczewski; Current-driven excitation of magnetic multilayers; Journal of Mangetism and Magnetic Materials; 15; 1996; L1-L7.
S. Mangin et al.; Current-induced magnetization reversal in nanopillars with perpendicular anisotropy; Nature Materials; vol. 5; Mar. 2006.
L. Berger; Emission of spin waves by a magnetic multilayer traversed by a current; Physical Review B; vol. 54, No. 13; Oct. 1, 1996-I.

* cited by examiner

*Primary Examiner* — Hoai V Ho
(74) *Attorney, Agent, or Firm* — Dentons US LLP

(57) ABSTRACT

A storage element includes a storage layer which has magnetization vertical to the film surface and of which the direction of magnetization changes, a magnetization fixed layer which has magnetization vertical to the film surface serving as a reference of information, and an insulating layer, and the direction of magnetization of the storage layer changes by injecting spin-polarized electrons in the laminated direction of the layer structure so as to perform information recording, the size of an effective demagnetizing field that the storage layer receives is configured to be smaller than a saturated magnetization amount of the storage layer, and a ferromagnetic layer material constituting the storage layer has CoFeB as the base material and an anti-corrosive element is added to the base material.

7 Claims, 14 Drawing Sheets

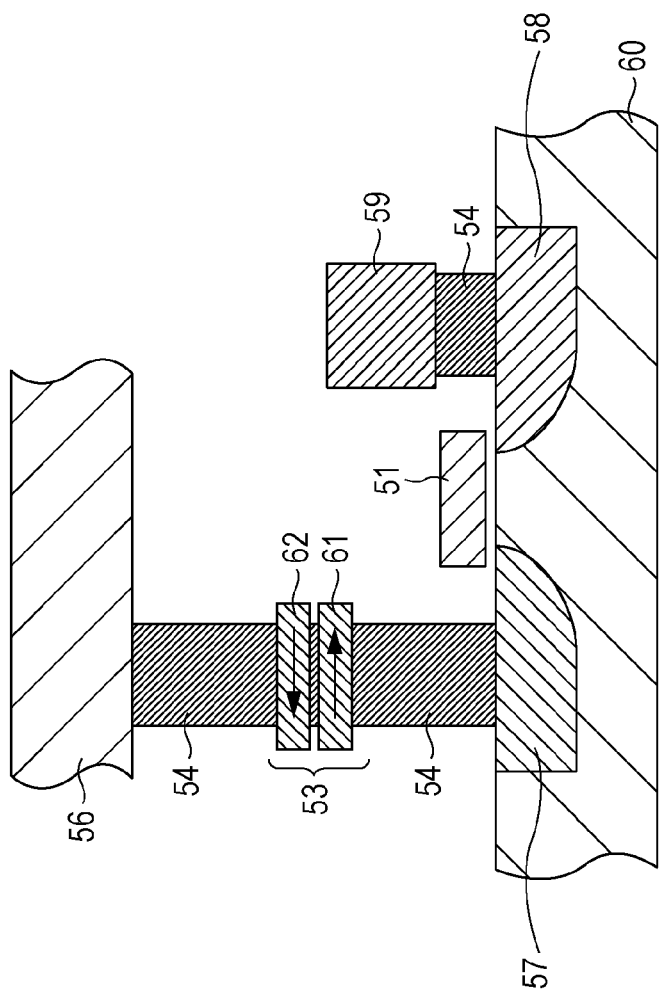

STORAGE ELEMENT AND MEMORY DEVICE

BACKGROUND

The present disclosure relates to a storage element which includes a storage layer storing a magnetization state of a ferromagnetic layer as information and a magnetization fixed layer of which the direction of magnetization is fixed, and changes the direction of magnetization of the storage layer with the flow of a current, and a memory device provided with the storage element.

In information equipment such as a computer, or the like, DRAMS with high operation speed and high density are widely used as random access memories.

However, since such DRAMs are volatile memories in which information is lost when the power is disconnected, non-volatile memories in which information is not lost have been demanded.

Therefore, attention has been paid to a magnetic random access memory (MRAM) which records information with magnetization of a magnetic substance as a candidate for non-volatile memories, and development thereof is underway.

An MRAM records information such that current is made to flow on two kinds of address lines (including a word line and a bit line) respectively, which are substantially orthogonal to each other, and magnetization of magnetic layers of magnetic storage elements provided in the junctions of the address lines is reversed by current magnetic fields generated from each of the address lines.

FIG. 12 shows a schematic diagram (perspective view) of a general MRAM.

A drain region 108, a source region 107, and a gate electrode 101, which constitute a selection transistor for selecting each memory cell, are formed respectively in a portion which is separated by an element separating layer 102 of a semiconductor substrate 110 such as a silicon substrate, or the like.

In addition, a word line 105 extending in the front-rear direction of the drawing is provided above the gate electrode 101.

The drain region 108 is formed in the selection transistor in the left-right side of the drawing in common, and a wiring 109 is connected to the drain region 108.

In addition, a magnetic storage element 103 having a storage layer in which the direction of magnetization is reversed is disposed between the word line 105 and a bit line 106 which is disposed in the upper portion and extends in the left-right direction of the drawing. The magnetic storage element 103 includes, for example, a magnetic tunnel junction element (MTJ element).

Furthermore, the magnetic storage element 103 is electrically connected to the source region 107 through a by-pass line 111 in the horizontal direction and a contact layer 104 in the longitudinal direction.

A current magnetic field is applied to the magnetic storage element 103 by making current flow to the word line 105 and the bit line 106 to reverse the direction of magnetization of the storage layer of the magnetic storage element 103, whereby recording of information can be performed.

Then, in order to stably hold the recorded information in a magnetic memory such as an MRAM, or the like, it is necessary for a magnetic layer (storage layer) which records information to have a certain degree of coercive force.

On the other hand, in order to rewrite the recorded information a certain amount of current has to be flowed in the address lines.

However, since the address lines become delicate as elements constituting the MRAM become fine, it becomes difficult to make sufficient current flow.

Hence, as a configuration which enables the magnetization reversal with a smaller amount of current, attention has been paid to a memory configured to use the magnetization reversal by spin injection (for example, refer to Japanese Unexamined Patent Application Publication No. 2003-17782, U.S. Pat. No. 6,256,223, Japanese Unexamined Patent Application Publication No. 2008-227388, PHYs. Rev. B, 54.9353 (1996), and J. Magn. Mat., 159, L1 (1996)).

The magnetization reversal by spin injection is performed such that electrons spin-polarized passing through a magnetic substance are injected to another magnetic substance to bring about magnetization reversal in the magnetic substance.

In respect to a giant magneto-resistive effect element (GMR element) or a magnetic tunnel junction element (MTJ element), for example, the direction of magnetization of at least part of a magnetic layer of such an element can be reversed by making a current flow in the vertical direction of a film surface of the element.

In addition, the magnetization reversal by spin injection is advantageous in that, even when the element becomes fine, the magnetization reversal can be realized without increasing the current.

FIGS. 13 and 14 show schematic diagrams of a memory device configured to use the magnetization reversal by spin injection described above. FIG. 13 is a perspective view and FIG. 14 is a cross-sectional view.

A drain region 58, a source region 57, and a gate electrode 51, which constitute a selection transistor for selecting each memory cell, are formed respectively in a portion which is separated by an element separating layer 52 of a semiconductor substrate 60 such as a silicon substrate, or the like. Among these, the gate electrode 51 also serves as a word line extending in the front-rear direction of FIG. 14.

The drain region 58 is formed in the selection transistor in the left and right sides of FIG. 13 in common, and a wiring 59 is connected to the drain region 58.

In addition, a storage element 57 which includes a storage layer of which the direction of magnetization is reversed by spin injection is disposed between the source region 57 and a bit line 56 which is disposed in the upper portion and extends to the left-right direction of FIG. 13.

The storage element 53 includes, for example, a magnetic tunnel junction element (MTJ element). The storage element 53 has two magnetic layers 61 and 62. Among the two magnetic layers 61 and 62, one magnetic layer is set to a magnetization fixed layer of which the direction of magnetization is fixed and the other magnetization layer is set to a magnetization free layer, that is, a storage layer of which the direction of magnetization changes.

In addition, the storage element 53 is connected to the bit line 56 and the source region 57 respectively through a contact layer 54 in the upper and lower sides. Accordingly, the direction of magnetization of the storage layer can be reversed by spin injection by making a current flow to the storage element 53.

A memory device configured to use the magnetization reversal by spin injection as above has characteristics in that the device structure can be simplified and for this reason high density thereof is possible, in comparison to a general MRAM shown in FIG. 12.

In addition, in comparison to the general MRAM which performs magnetization reversal by an external magnetic field, the memory device is advantageous in that the writing current does not increase even when miniaturization of the element advances, by using the magnetization reversal by spin injection.

SUMMARY

The MRAM, however, performs writing (recording) of information with a current magnetic field generated such that a writing wiring (word lines and bit lines) is provided separate from a storage element and a current is made to flow through the writing wiring. For this reason, it is possible to make a sufficient amount of current necessary for writing flow through the writing wiring.

On the other hand, in the case of the memory device configured to use the magnetization reversal by spin injection, it is necessary to reverse the direction of magnetization of the storage layer by performing spin injection with current flowing through the storage element.

In addition, in order to select a memory cell performing writing from the performance of writing (recording) of information by making current directly flow through the storage element, a memory cell is configured by connecting the storage element to the selection transistor. In this case, the intensity of the current flowing in the storage element is limited to that of a current that can flow in the selection transistor (saturated current of the selection transistor).

For this reason, it is necessary to perform writing with current in intensity equal to or lower than that of the saturated current of the selection transistor, and to lower the current flowing in the storage element by improving efficiency of spin injection.

In addition, in order to intensify readout signals, it is necessary to secure a high change rate of magnetic resistance, and to that end, it is effective to configure a storage element in which an intermediate layer coming into contact with the both sides of the storage layer is set to a tunnel insulating layer (tunnel barrier layer).

In the case where a tunnel insulating layer is used as an intermediate layer, a limitation is placed on the amount of the current flowing through the storage element in order to prevent dielectric breakdown of the tunnel insulating layer. Also in that regard, it is necessary to suppress current during spin injection.

Since the current value is proportional to the film thickness of the storage layer and proportional to the square of the saturated magnetization of the storage layer, it is understood that the factors (film thickness or saturated magnetization) may be adjusted to lower the current value (for example, refer to F. J. Albert et al., Appl. Phy. Lett., 77, 3809 (2000)).

In addition, US Patent Application Publication No. 2005-0184839 A1 shows that a current value can be lowered if a magnetization amount (Ms) of a recording material is lowered.

On the other hand, however, a non-volatile memory can be attained when it stores information written by current. In other words, it is necessary to secure stability in thermal fluctuation (thermal stability) of a storage layer.

In a case of a storage element using the magnetization reversal by spin injection, since the volume of the storage layer is smaller than that of an MRAM of the related art, thermal stability tends to decrease considering simply.

If the thermal stability in the storage layer is not secured, the reversed direction of magnetization is reversed again by heat, thereby causing an error in writing.

In addition, in a case where high capacity of the storage element using the magnetization reversal by spin injection progresses, the volume of the storage element becomes smaller, and therefore, securing thermal stability is a serious task.

For this reason, in the storage element using the magnetization reversal by spin injection, thermal stability is a remarkably important feature.

Therefore, in order to present the storage element configured that the direction of magnetization of the storage layer is reversed by spin injection as a memory, it is necessary to lower the intensity of a current necessary for the magnetization reversal by spin injection to the intensity equal to or lower than a saturated current of a transistor, and to secure thermal stability for stably holding written information.

As above, lowering of the saturated magnetization amount Ms of the storage layer and thinning of the storage layer are considered to lower the current necessary for the magnetization reversal by spin injection. For example, as in US Patent Application Publication No. 2005-0184839 A1, it is effective to use a material with a low saturation magnetization amount Ms for the material of the storage layer.

When a material with a low saturation magnetization amount Ms is simply used as above, however, it is difficult to secure thermal stability that helps to hold information stably.

In regard to an ST-MRAM, it is desired to realize a storage element that can improve thermal stability without increasing writing current.

Herein, as a ferromagnetic substance used in the ST-MRAM, various materials are examined, but it is generally deemed that a material having vertical magnetic anisotropy is more appropriate for low-power and high-capacity than one having in-plane magnetic anisotropy. This is because vertical magnetization has a low energy barrier that is supposed to be overcome during spin torque magnetization reversal, and high magnetic anisotropy that a vertical magnetization film has is advantageous to maintain thermal stability of a storage carrier that is made to be fine by high-capacity.

As a magnetic material having vertical magnetic anisotropy, an alloy including Co and Fe is employed, but when such a magnetic material is used, there is a concern that a rise of resistance resulting from oxidization, that is, corrosion is promoted in thermal or other processing due to the inclusion of Fe in the composition.

Particularly, in a high density storage element (furthermore, in a high-capacity memory) that is demanded to have a fine element diameter equal to or shorter than 100 nm, there is a problem in that it is difficult to ignore a rise of resistance resulting from erosion from an outer circumference portion to a magnetic layer.

It is desirable for the present disclosure to aim to make a reduction in a writing current be compatible with thermal stability in an ST-MRAM, and to provide a storage element that can prevent a rise of resistance during microfabrication of a storage layer with lower power consumption.

According to an embodiment of the present disclosure, there is provided a storage element including a storage layer which has magnetization vertical to the film surface and of which the direction of magnetization changes corresponding to information, a magnetization fixed layer which has magnetization vertical to the film surface serving as a reference of information stored in the storage layer, and an insulating layer as a non-magnetic body which is provided between the storage layer and the magnetization fixed layer.

In addition, the direction of magnetization of the storage layer changes by injecting spin-polarized electrons in the laminated direction of the layer structure having the storage layer, the insulating layer, and the magnetization fixed layer and then recording of information is performed on the storage layer, and the size of an effective demagnetizing field that the storage layer receives is configured to be smaller than a saturated magnetization amount of the storage layer.

Furthermore, a ferromagnetic layer material constituting the storage layer has CoFeB as the base material and an anti-corrosive element is added to the base material.

In addition, according to an embodiment of the present disclosure, there is provided a memory device including a storage element which holds information by a magnetization state of a magnetic body, and two kinds of lines which intersect with each other, and a storage element thereof has the configuration of the above-described storage element according to the embodiment of the present disclosure, the storage element is disposed between the two kinds of lines, and a current is made to flow in the storage element in the laminated direction through the two kinds of lines to perform injection of spin-polarized electrons.

According to the above-described configuration of the storage element according to the embodiment of the disclosure, the storage layer which holds information by a magnetization state of a magnetic body is included, the magnetization fixed layer is provided for the storage layer through the intermediate layer, the intermediate layer is formed of an insulating body, the direction of magnetization of the storage layer changes by injection of the spin-polarized electrons in the laminated direction to perform recording of information on the storage layer, and therefore information can be recorded by making a current flow in the laminated direction and injecting the spin-polarized electrons.

In addition, by setting the size of the effective demagnetizing field that the storage layer receives to be smaller than a saturated magnetization amount of the storage layer, the demagnetizing field that the storage layer receives is low, and an amount of a writing current necessary for reversing the direction of magnetization of the storage layer can be reduced.

On the other hand, since the amount of the writing current can be reduced without lowering the saturated magnetization amount of the storage layer, it is possible to secure sufficient thermal stability of the storage layer setting the saturated magnetization amount of the storage layer to be sufficient.

Furthermore, the storage element according to the embodiment of the disclosure has magnetization vertical to the storage layer and the magnetization fixed layer. One having vertical magnetic anisotropy is more appropriate for low power consumption and high capacity than one having in-plane magnetic anisotropy. The reason is that vertical magnetization has a low energy barrier to surpass during spin torque magnetization reversal, and thermal stability for holding information in the storage layer is advantageous due to the high magnetic anisotropy that a vertical magnetization film possesses.

In addition, in the storage element according to the embodiment of the disclosure, a ferromagnetic layer material constituting the storage layer has CoFeB as the base material and an anti-corrosive element is added to the base material. With the configuration, a rise in resistance during microfabrication of the storage layer can be prevented, whereby a storage element with low power consumption can be provided.

In addition, according to the above-described configuration of the memory device according to the embodiment of the disclosure, the storage element is disposed between the two kinds of lines, a current flows in the storage element in the laminated direction through the two kinds of lines, and the spin-polarized electrons are injected to perform recording information by making the current flow in the storage element in the laminated direction through the two kinds of lines, and performing spin injection.

In addition, since it is possible to reduce the amount of the writing current of the storage element without reducing the saturated magnetization amount of the storage layer, it is possible to stably hold information recorded on the storage element and to reduce power consumption of the memory device.

In addition, in the storage element in that case, an anti-corrosive element is added to the base material of the ferromagnetic layer material constituting the storage layer, and therefore, a rise in resistance during microfabrication of the storage layer is prevented, whereby realization of a memory device with low power consumption is intended. In addition, improvement of thermal stability is also intended with the addition of the anti-corrosive element to the base material of the ferromagnetic layer material constituting the storage layer.

According to the disclosure, since it is possible to reduce the amount of the writing current of the storage element without reducing the saturated magnetization amount of the storage layer, it is possible to secure sufficient thermal stability that is information holding capability and to configure a storage element excellent in characteristic balance. Accordingly, it is possible to obtain a sufficient operation margin of the storage element without operation errors.

Therefore, it is possible to realize a memory device which stably operates with high reliability.

In addition, the writing current is reduced, thereby reducing power consumption during performance of writing in the storage element. In short, in light of that point, power consumption of the entire memory device can be reduced.

In addition, according to the disclosure, by adding an anti-corrosive element to the base material of the ferromagnetic layer material constituting the storage layer, a rise in resistance during microfabrication of the storage layer is prevented, and in light of this point, realization of a memory device with low power consumption is intended.

In addition, the addition of an anti-corrosive element to the base material of the ferromagnetic layer material constituting the storage layer contributes also to improvement of thermal stability.

BRIEF DESCRIPTION OF THE DRAWINGS

FIG. 14 is a cross-sectional diagram of the memory device of FIG. 13.

DETAILED DESCRIPTION OF EMBODIMENTS

Figure 1:
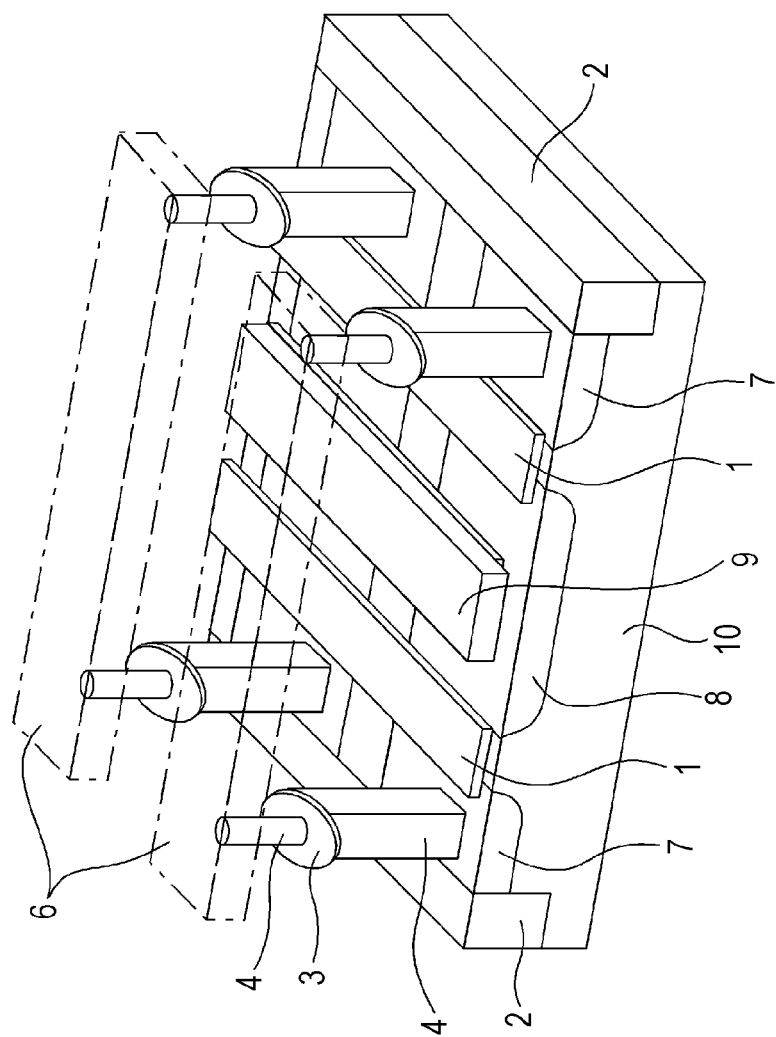
FIG. 1 is an illustrative diagram of a schematic configuration of a memory device according to a precedent example and an embodiment.

Hereinafter, embodiments of the present disclosure will be described in the following order.
<1. Storage Element as Precedent Example>
[1-1. Overview of Storage Element of Precedent Example]
[1-2. Configuration of Precedent Example 1]
[1-3. Experiment regarding Precedent Example 1]
[1-4. Configuration of Precedent Example 2]
[1-5. Experiment regarding Precedent Example 2]
<2. Storage Element of Embodiment>
[2-1. Regarding Problem of Precedent Example]
[2-2. Configuration of Storage Element of Embodiment]
[2-3. Experiment of Storage Element of Embodiment]
<3. Modified Example>
<1. Storage Element as Precedent Example>
[1-1. Overview of Storage Element of Precedent Example]

First, before noticing a storage element of the disclosure, the overview of a storage element as a precedent example, which forms the basis of the foregoing storage element, will be described.

The storage element as the precedent example (and an embodiment to be described later) performs recording of information by reversing the direction of magnetization of a storage layer thereof by the above-described spin injection.

The storage layer is constituted by a magnetic substance such as a ferromagnetic layer, and holds information in a magnetized state of the magnetic substance (the direction of magnetization).

To be described later, the storage element adopts, for example, a layer structure as shown in an example in FIG. 2, includes a storage layer 17 and a magnetization fixed layer 15 as at least two magnetic layers, and includes an insulating layer 16 (tunnel insulating layer) between the two magnetic layers as an intermediate layer.

The storage layer 17 has magnetization vertical to the film surface and the direction of the magnetization changes corresponding to information.

The magnetization fixed layer 15 has magnetization vertical to the film surface serving as a reference of information stored in the storage layer 17.

The insulating layer 16 is a non-magnetic substance, and provided between the storage layer 17 and the magnetization fixed layer 15.

In addition, by injection electrons spin-polarized in a laminating direction of the layer structure including the storage layer 17, the insulating layer 16, and the magnetization fixed layer 15, the direction of the magnetization of the storage layer 17 changes to record information on the storage layer 17.

A basic operation of reversing the direction of the magnetization of the magnetic layer (storage layer 17) by spin injection is to make a current of which the intensity is equal to or higher than a threshold value flow in a storage element formed of a giant magneto-resistive effect element (GMR element) or a tunnel magneto-resistive effect element (MTJ element) in the direction vertical to the film surface thereof. At this time, the polarity (direction) of the current depends on the direction of reversed magnetization.

When a current of which the absolute value is smaller than the threshold value is made to flow, magnetization reversal does not occur.

When the direction of the magnetization of the magnetic layer is reversed by spin injection, a threshold value Ic of a necessary current is generally expressed as follows:

$$Ic = A \cdot \alpha \cdot Ms \cdot V \cdot Hd / 2\eta.$$

Wherein A is a constant, $\alpha$ is a spin-breaking constant, $\eta$ is a spin injection efficiency, Ms is a saturated magnetization amount, V is a volume of the storage layer, and Hd is an effective demagnetizing field.

As expressed in the formula, the threshold value of the current can be arbitrarily set by controlling the volume of the magnetic layer V, the saturated magnetization of the magnetic layer Ms, the spin injection efficiency $\eta$, and the spin-breaking constant $\alpha$.

Strictly speaking, when the direction of the magnetization of the magnetic layer is reversed by spin torque magnetization reversal, the threshold value Ic of a necessary current differs by the fact that an easy magnetization axis of the magnetic layer is the in-plane direction or the vertical direction.

The storage element of the precedent example of the embodiment is of a vertical magnetization type, but if a reversal current for reversing the direction of magnetization of a magnetic layer is set to Ic-para in a case of a storage element of an in-plane magnetization type of the related art, when reversal is performed from the same direction to the opposite direction (the same direction and the opposite direction are magnetization directions of the storage layer when the magnetization direction of the magnetization fixed layer is set to a reference), $$Ic\_para = (A \cdot \alpha \cdot Ms \cdot V / g(0) / P)(Hk + 2\pi Ms),$$

and when reversal is performed from the opposite direction to the same direction, $$Ic\_para = -(A \cdot \alpha \cdot Ms \cdot V / g(\pi) / P)(Hk + 2\pi Ms).$$

On the other hand, if a reversal current of the storage element of the vertical magnetization type as in the example is set to Ic_perp, Ic_perp = $(A \cdot \alpha \cdot Ms \cdot V / g(0) / P)$ (Hk − 4$\pi$Ms), when reversal is performed from the same direction to the opposite direction, and Ic_perp = $-(A \cdot \alpha \cdot Ms \cdot V / g(\pi) / P)$ (Hk − 4$\pi$Ms), when reversal is performed from the opposite direction to the same direction.

Wherein A is a constant, $\alpha$ is a dumping constant, Ms is saturated magnetization, V is a element volume, P is a spin polarization rate, g(0) and g($\pi$) are coefficients corresponding to efficiency of spin torque transmitted to the other magnetic layer respectively in the same direction and the opposite direction, and Hk is magnetic anisotropy (refer to Nature Materials., 5, 210 (2006)).

In each formula above, when (Hk−4πMs) of the vertical magnetization type and (Hk+2πMs) of the in-plane magnetization type are compared to each other, it can be understood that the vertical magnetization type is more proper to lowering of a recording current.

The storage element of the example performs reading of information based on a difference in resistance by a tunnel magneto-resistive effect. In other words, when the tunnel magneto-resistive effect is great, the output becomes large. A tunnel magneto-resistive effect TMR is expressed by Formula (1) using a spin polarization rate P.

$$TMR\ (\%) = P_1 P_2 / (1 - P_1 P_2) \times 100 \quad \text{Formula (1)}$$

Herein, $P_1$ is a spin polarization rate of a fixed layer and $P_2$ is a spin polarization rate of a recording layer. In Formula (1), it can be understood that, when a spin polarization rate becomes high, a TMR becomes great.

In addition, based on comparison to the formula regarding a reversal current, it is also understood that low current and high output (high TMR) are in a compatible relationship.

In the precedent example and the embodiment, the storage element is configured which includes a magnetic layer (storage layer 17) that can hold information in a magnetization state and the magnetization fixed layer 15 of which the direction of magnetization is fixed.

In order to be able to be present as a memory, the element has to hold written information. The capacity to hold information is determined based on a value of an index $\Delta(KuV/k_B T)$ of thermal stability. This $\Delta$ is expressed by Formula (2) given below.

$$\Delta = KV/k_B T = MS \cdot V \cdot H_K \cdot (1/2 k_B T) \quad \text{Formula (2)}$$

Wherein Hk is an effective anisotropy magnetic field, $k_B$ is the Boltzmann constant, T is temperature, Ms is a saturated magnetization amount, V is the volume of the storage layer.

The effective anisotropy magnetic field Hk is incorporated with influence of such as shape magnetic anisotropy, induction magnetic anisotropy, crystal magnetic anisotropy, or the like, and is equivalent to coercive force when a coherent rotation model of a single magnetic domain is assumed.

The index of thermal stability Δ and the threshold value of a current Ic are mostly in a trade-off relationship. For this reason, compatibility of the factors is a problem so as to maintain memory features in many cases.

In regard to a threshold value of a current that changes the magnetization state of the storage layer 17, practically in a TMR element in a substantially elliptical shape in which the thickness of the storage layer 17 is 2 nm and the plane pattern is 100 nm×150 nm, a threshold value in the positive side is +0.5 mA, a threshold value in the negative side is −0.3 mA, and current density at that time is about $3.5 \times 10^6$ A/cm². These factors agree with the above formula regarding Ic.

In contrast, for a general MRAM performing magnetization reversal by a current magnetic field, several mA or higher writing current is necessary.

Thus, when magnetization reversal by spin injection is performed, the threshold value of a writing current is sufficiently small as described above, and therefore, it is understood that the reversal method is effective to lower power consumption of an integrated circuit.

Figure 12:
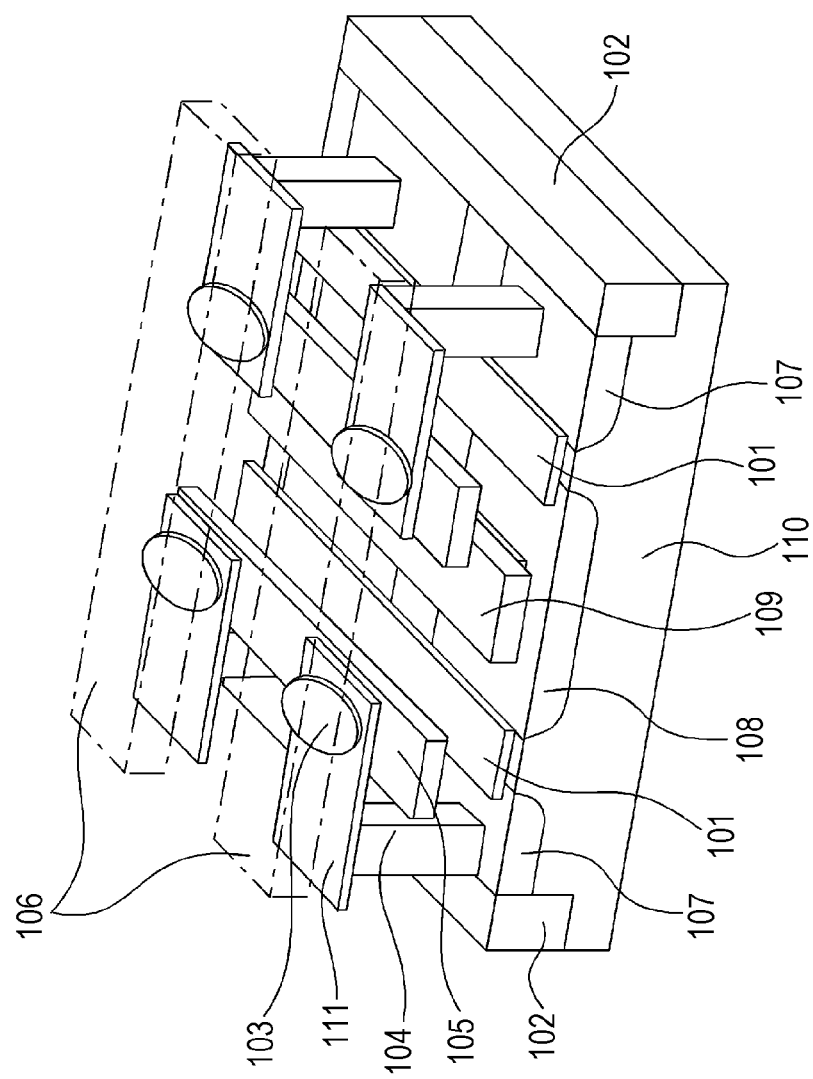
FIG. 12 is a perspective diagram schematically showing a configuration of an MRAM in the related art.
Figure 13:
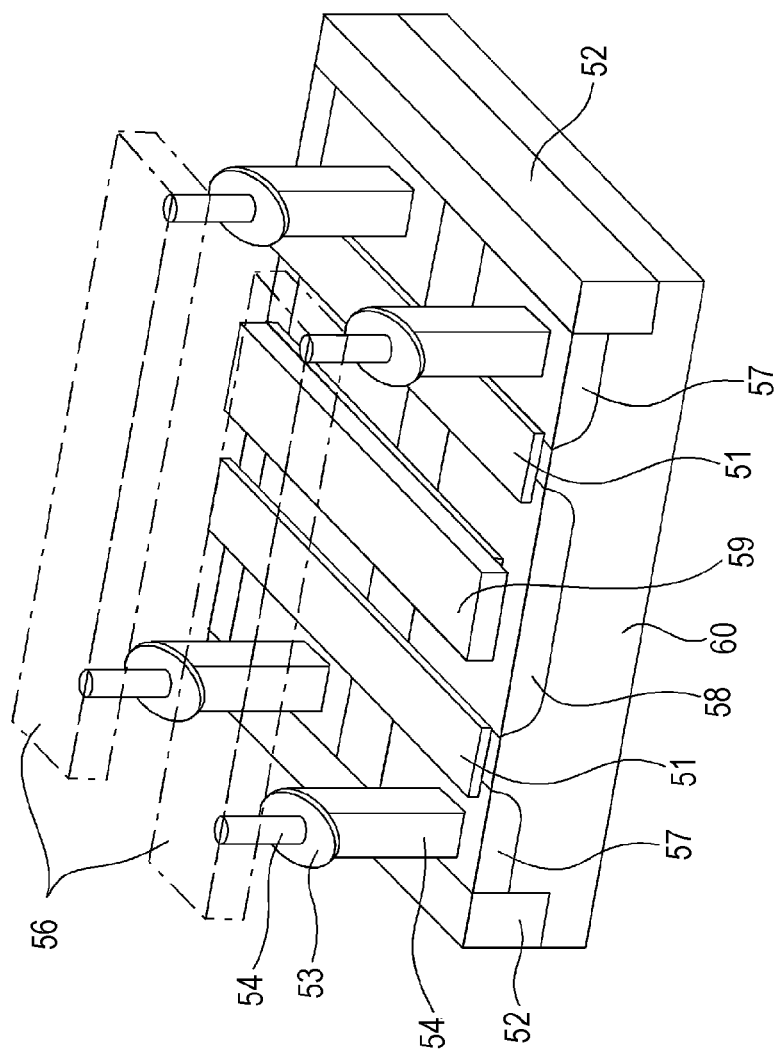
FIG. 13 is an illustrative diagram of a schematic configuration of a memory device using magnetization reversal by spin injection.

In addition, since a wiring for generating a current magnetic field (wiring 105 in FIG. 12), which is necessary for the general MRAM, is not necessary for the reversal method, the method is advantageous in terms of an integration degree, in comparison to the general MRAM.

In addition, since information writing (recording) is performed by making a current directly flow in the storage element when magnetization reversal by spin injection is performed, in order to select a memory cell performing writing, a memory cell is configured by connecting the storage element to the selection transistor.

In this case, the intensity of the current flowing through the storage element is limited to the intensity of a current that can flow in the selection transistor (saturated current of the selection transistor).

In order to make the threshold value of a current Ic of the magnetization reversal by spin injection lower than the saturated current of the selection transistor, it is found out that the saturated magnetization amount Ms of the storage layer 17 may be reduced.

However, when the saturated magnetization amount Ms is simply reduced (for example, as in US Patent Application Publication No. 2005-0184839 A1), thermal stability of the storage layer 17 is seriously impaired, whereby the function as a memory is not fulfilled.

In order to configure a memory, it is necessary for the index of thermal stability Δ to have a size equal to or higher than a certain level.

Thus, as a result of various examinations conducted by the inventors of the present application, it is found that the size of an effective demagnetizing field (Meffective) that the storage layer 17 receives is smaller than the saturated magnetization amount Ms of the storage layer 17, by selecting, for example, the composition of CoFeB as the ferromagnetic layer constituting the storage layer 17.

By using the above-described ferromagnetic material, the size of the effective demagnetizing field that the storage layer 17 receives is configured to be smaller than the saturated magnetization amount Ms of the storage layer 17.

Accordingly, since the size of the demagnetizing field that the storage layer 17 receives can be reduced, an effect is obtained in which the threshold value of a current Ic expressed by the above-described formula regarding Ic is lowered, without diminishing the thermal stability Δ expressed by Formula (2).

Furthermore, the inventors found that CoFeB is magnetized in a film surface vertical direction within a limited composition range in the selected composition of CoFeB described above, whereby sufficient thermal stability can be secured also in a submicroscopic storage element that can realize a Gbit-class capacity.

Therefore, a stabilized memory can be formed in which information writing with a low current is possible in a state of maintaining thermal stability in a Gbit-class spin injection type magnetization reversal memory.

In the precedent example and the embodiment, the size of the effective magnetizing field that the storage layer 17 receives is configured to be smaller than the saturated magnetization amount Ms of the storage layer 17, in other words, the value of the ratio of the effective demagnetizing field to the saturated magnetization amount Ms of the storage layer 17 is set to be smaller than 1.

Furthermore, considering a saturated current value of the selection transistor, the magnetic tunnel junction (MTJ) element is constituted as a non-magnetic intermediate layer between the storage layer 17 and the magnetization fixed layer 15, using a tunnel insulating layer (insulating layer 16) formed of an insulating body.

The constitution of the magnetic tunnel junction (MTJ) element using the tunnel insulating layer makes it possible to increase a magneto-resistance change rate (MR ratio) and to increase the intensity of a readout signal, in comparison to the case where a giant magneto-resistive effect (GMR) element is constituted using a non-magnetic conductive layer.

In addition, when magnesium oxide (MgO) in particular is used as a material of the tunnel insulating layer 16, the magneto-resistance change rate (MR ratio) can be increased in comparison to a case where aluminum oxide, which hitherto has been generally used, is used.

In addition, spin injection efficiency generally depends on the MR ratio, and the spin injection efficiency improves as the MR ratio becomes great, thereby lowering current density of magnetization reversal.

Thus, if magnesium oxide is used as a material of the tunnel insulating layer 16 serving as an intermediate layer and at the same time, the above-described storage layer 17 is used, threshold writing current by spin injection can be reduced, and information writing (recording) can be performed with a low current. In addition, the intensity of a readout signal can be increased.

Accordingly, threshold writing current by spin injection can be reduced, and information writing (recording) can be performed with a low current by securing the MR ratio (TMR ratio). In addition, the intensity of a readout signal can be increased.

When the tunnel insulating layer 16 is formed of a magnesium oxide (MgO) film, it is desirable that the MgO film be crystallized to maintain crystal orientation in a (001) direction.

Furthermore, the intermediate layer (tunnel insulating layer 16) between the storage layer 17 and the magnetization fixed layer 15 can be configured to be formed not only of magnesium oxide but also of various insulating bodies, induction bodies, and semiconductors including, for example, aluminum oxide, aluminum nitride, $SiO_2$, $Bi_2O_3$, $MgF_2$, CaF, $SrTiO_2$, $AlLaO_3$, AlNO, and the like.

It is necessary to control the area resistance value of the tunnel insulating layer 16 to be equal to or lower than several+ $\Omega\mu m^2$ in terms of obtaining current density necessary for reversing the direction of magnetization of the storage layer 17 by spin injection.

In addition, in the tunnel insulating layer 16 formed of the MgO film, it is necessary to set the film thickness of the MgO film to be equal to or thinner than 1.5 nm in order to the area resistance value to be within the above-described range.

In addition, it is desirable to make the storage element small so that the direction of magnetization of the storage layer 17 is easily reversed with a low current.

For that reason, the area of the storage element is preferably set to be equal to or smaller than 0.01 $\mu m^2$.

Furthermore, the storage layer 17 can be directly laminated with another ferromagnetic layer having a different composition. In addition, it is possible to laminate a ferromagnetic layer and a soft magnetic layer, or laminating a plurality of ferromagnetic layers through a soft magnetic layer or a non-magnetic layer. Also in the case in which laminating is performed as above, the effect as in the precedent example is obtained.

Particularly, in the configuration in which the plurality of ferromagnetic layers are laminated through the non-magnetic layer, since the intensity of interaction between the ferromagnetic layers can be adjusted, an effect is obtained in which the magnetization reversal current can be suppressed so as not to increase even when the dimension of the storage element is equal to or smaller than a submicron unit. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof can be used.

It is desirable for the magnetization fixed layer 15 and the storage layer 17 to have anisotropy in one direction.

In addition, respective film thickness of the magnetization fixed layer 15 and the storage layer 17 is preferably 0.5 nm to 30 nm.

Another configuration of the storage element can be the same as that of the storage element of the related art which records information by spin injection.

The direction of magnetization of the magnetization fixed layer 15 can be configured to be fixed by only using a ferromagnetic layer or using anti-ferromagnetic coupling of an anti-ferromagnetic layer and a ferromagnetic layer.

In addition, the magnetization fixed layer 15 can have a structure formed of a single ferromagnetic layer, or a multilayered ferri-pin structure in which a plurality of ferromagnetic layers is laminated via a non-magnetic layer.

As a material of the ferromagnetic layer constituting the magnetization fixed layer 15 of the multilayered ferri-pin structure, Co, CoFe, CoFeB, or the like can be used. In addition, as a material of the non-magnetic layer, Ru, Re, Ir, Os, or the like can be used.

As a material of the anti-ferromagnetic layer, a magnetic body such as a FeMn alloy, a PtMn alloy, a PtCrMn alloy, a NiMn alloy, an IrMn alloy, NiO, $Fe_2O_3$, or the like can be exemplified.

In addition, by adding, to the above magnetic body, a non-magnetic element such as Ag, Cu, Au, Al, Si, Bi, Ta, B, C, O, N, Pd, Pt, Zr, Hf, Ir, W, Mo, Nb, or the like, a magnetic feature can be adjusted, or other various physical properties such as stability of a crystalline structure or a crystalline material, and the like can be adjusted.

In addition, in regard to a film structure of the storage element, it is not a problem to employ a structure in which the storage layer 17 is disposed below the magnetization fixed layer 15 and a structure in which the storage layer 17 is disposed above the magnetization fixed layer 15. Furthermore, a so-called dual structure in which the magnetization fixed layer 15 is present above and below the storage layer 17 can be employed without problems.

Furthermore, as a method of reading information recorded in the storage layer 17 of the storage element, reading may be performed with a ferromagnetic tunnel current flowing through the insulating layer 16 by providing a magnetic layer serving as a reference of information in the storage layer 17 of the storage element through a thin insulating film, or with the magneto-resistive effect.

[1-2. Configuration of Precedent Example 1]

For the precedent example of the present disclosure, there are two examples of Precedent Example 1 and Precedent Example 2.

First, a specific configuration of Precedent Example 1 will be described.

FIG. 1 shows a schematic configuration diagram (perspective view) of a memory device as Precedent Example 1.

The memory device is formed by disposing a storage element 3 which can hold information in a magnetization state in the vicinity of the junction of two kinds of address lines (for example, a word line and a bit line), which are orthogonal to each other.

In other words, each of a drain region 8, a source region 7, and a gate electrode 1, which constitutes a selection transistor for selecting each memory cell, is formed in the portion separated by the element separating layer 2 of a semiconductor substrate 10 such as a silicon substrate, or the like. Among these, the gate electrode 1 also serves as one address line (for example, the word line) expending in the front-rear direction in the drawing.

The domain region 8 is commonly formed in the selection transistors in the left and right sides of the drawing, and a wiring 9 is connected to the drain region 8.

In addition, a storage element 3 is disposed between the source region 7 and the other address line (for example, the bit line) 6, which is disposed in the upper side and extends in the left-right direction in the drawing. The storage element 3 includes a storage layer formed of a ferromagnetic layer of which the direction of magnetization is reversed by spin injection.

In addition, the storage element 3 is disposed in the vicinity of the junction of the two kinds of address lines 1 and 6.

The storage element 3 is connected to the bit line 6 and the source region 7 respectively via upper and lower contact layers 4.

Accordingly, by having a current to flow in the storage element 3 in the upper and lower directions through the two kinds of address lines 1 and 6, the direction of magnetization of the storage layer can be reversed by spin injection.

Figure 2:
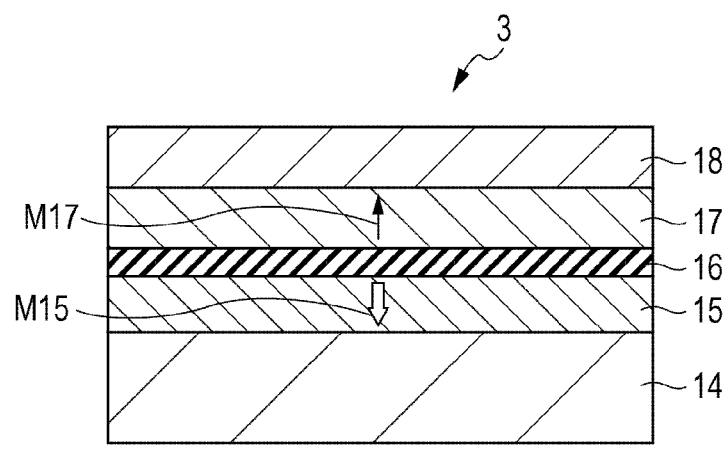
FIG. 2 is a cross-sectional diagram of a storage element according to a precedent example and an embodiment.

In addition, FIG. 2 shows a cross-sectional diagram of the storage element 3 of the memory device of Precedent Example 1.

As shown in FIG. 2, the storage element 3 is laminated with a foundation layer 14, the magnetization fixed layer 15, the insulating layer 16, the storage layer 17, and a cap layer 18 in order from the lower layer.

In this case, the magnetization fixed layer 15 is provided in the lower layer side of the storage layer 17 in which the direction of magnetization M17 is reversed by spin injection.

In a spin injection type magnetization reversal memory, "0" and "1" of information is defined by a relative angle of the magnetization M17 of the storage layer 17 and magnetization M15 of the magnetization fixed layer 15.

The insulating layer 16 serving as a tunnel barrier layer (tunnel insulating layer) is provided between the storage layer 17 and the magnetization fixed layer 15, and an MTJ element is constituted by the storage layer 17 and the magnetization fixed layer 15.

In addition, the foundation layer 14 is formed underneath of the magnetization fixed layer 15, and the cap layer 18 is formed on the storage layer 17.

The storage layer 17 includes a ferromagnetic body having a magnetic moment of which the direction of the magnetization M17 freely changes in the layer surface vertical direction. The magnetization fixed layer 15 a ferromagnetic body having a magnetic moment of which the direction of the magnetization M15 is fixed in the film surface vertical direction.

Storage of information is performed by the direction of magnetization of the storage layer 17 having uniaxial anisotropy. Writing thereof is performed by applying a current in the film surface vertical direction and then setting up spin torque magnetization reversal. As such, the magnetization fixed layer 15 is provided in the lower layer of the storage layer 17 in which the direction of magnetization is reversed by spin injection to serve as a reference of stored information (the direction of magnetization) in the storage layer 17.

In Precedent Example 1, CoFeB is used as the magnetization fixed layer 15.

Particularly, the composition of CoFeB is set as $(Co_xFe_y)_{100-z}B_z$ in the ranges of $0 \leq Co_x \leq 40$, $60 \leq Fe_y \leq 100$, $0 < B_z \leq 30$.

Since the magnetization fixed layer 15 serves as the reference of information, the direction of magnetization thereof is not supposed to be changed by recording or reading, however, it is not necessary for the direction to be fixed to a specific direction, and the movement thereof may be made to be more difficult than that of the storage layer 17 by further increasing coercive force thereof than that of the storage layer 17, by making the film thickness thereof be thicker, or by increasing the magnetic dumping constant.

When magnetization is fixed, the magnetization fixed layer 15 may be indirectly fixed by bringing an anti-ferromagnetic body such as PtMn, IrMn, or the like into contact with the magnetization fixed layer 15, or by coupling with a magnetic body brought into contact with such an anti-ferromagnetic body via a non-magnetic body such as Ru, or the like.

Particularly, Precedent Example 1 is characteristic in that the composition of the storage layer 17 of the storage element 3 is adjusted so that the size of an effective demagnetizing field that the storage layer 17 receives is smaller than the saturated magnetization amount Ms of the storage layer 17.

In other words, as described above, the size is made to be smaller than the saturated magnetization amount Ms of the storage layer 17 such that the composition CoFeB of the ferromagnetic material of the storage layer 17 is selected and the size of an effective demagnetizing field that the storage layer 17 receives is lowered.

Furthermore, in Precedent Example 1, the magneto-resistance change rate (MR ratio) can be raised when the insulating layer 16, which is an intermediate layer, is arranged with a magnesium oxide layer.

By raising the MR ratio as above, efficiency of spin injection can improve, and current density necessary for reversing the direction of the magnetization M17 of the storage layer 17 can be lowered.

The storage element 3 of Precedent Example 1 can be manufactured such that layers form the foundation layer 14 to the cap layer 18 are successively formed in a vacuum device, and then a pattern of the storage element 3 is formed by processing such as etching, or the like.

According to the above-described Precedent Example 1, since it is configured that the size of the effective demagnetizing field that the storage layer 17 of the storage element 3 receives is lower than the saturated magnetization amount Ms of the storage layer 17, the demagnetizing field that the storage layer 17 receives is lowered, and a writing current amount necessary for reversing the direction of the magnetization M17 of the storage layer 17 can be reduced.

On the other hand, since the writing current amount can be reduced without lowering the saturated magnetization amount Ms of the storage layer 17, thermal stability of the storage layer 17 can be sufficiently secured with a sufficient saturated magnetization amount Ms of the storage layer 17.

As such, since thermal stability that is information holding capacity can be sufficiently secured, the storage element 3 excellent in characteristic balance can be configured.

Accordingly, an operation margin of the storage element 3 can be sufficiently obtained and the storage element 3 can be stably operated, eliminating an operation error.

Therefore, a memory device which is stably operated with high reliability can be realized.

In addition, by reducing the writing current, power consumption of when writing is performed in the storage element 3 can be lowered.

Thus, power consumption of the entire memory device in which a memory cell is constituted by the storage element 3 of Precedent Example 1 can be lowered.

Therefore, power consumption can be lowered in the memory device which is excellent in an information holding characteristic, is stably operated having high reliability, including the storage element 3.

In addition, the memory device including the storage element 3 shown in FIG. 2 and having the configuration shown in FIG. 1 is advantageous in that a general semiconductor MOS forming process can be applied during the manufacturing of the memory device.

Therefore, the memory device of the embodiment can be applied as a general-purpose memory.

[1-3. Experiment Regarding Precedent Example 1]

Herein, in the configuration of the storage element of Precedent Example 1, by specifically selecting a material of the ferromagnetic layer constituting the storage layer 17, the size of the effective demagnetizing field that the storage layer 17 receives was adjusted, a sample of the storage element was prepared, and then characteristics thereof was examined.

In an actual memory device, a semiconductor circuit for switching or the like is present in addition to the storage element 3 as shown in FIG. 1, but herein, review was conducted only for a wafer formed only with a storage element for the purpose of examining magnetization reversal characteristics of the storage layer 17.

Experiment 1

A thermally-oxidized film with a thickness of 300 nm was formed on a silicon substrate with a thickness of 0.725 mm, and the storage element 3 having the structure shown in FIG. 2 was formed thereon.

Figure 3:
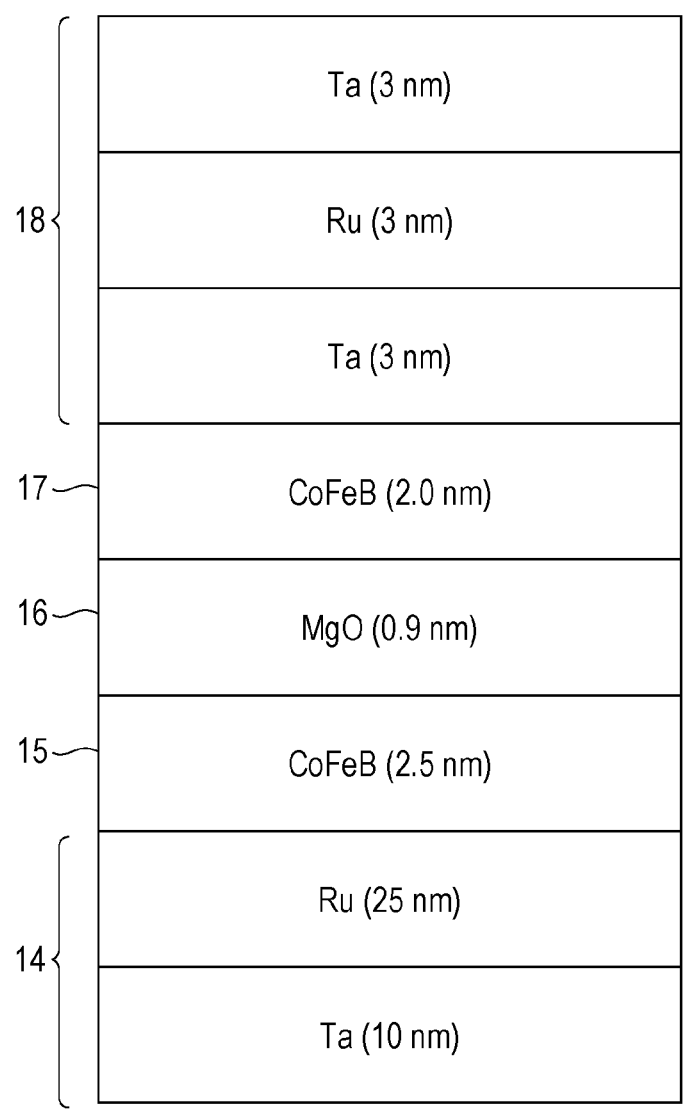
FIG. 3 is an illustrative diagram of a layer structure of a sample of the storage element used in the experiment of Precedent Example 1.

Specifically, in the storage element 3 with the structure shown in FIG. 2, materials of each layer and film thicknesses were selected as shown in FIG. 3.

Foundation layer 14: A laminated layer having a Ta film with a film thickness of 10 nm and an Ru film with a film thickness of 25 nm Magnetization fixed layer 15: A CoFeB film with a film thickness of 2.5 nm Tunnel insulating layer 16: A magnesium oxide film with a film thickness of 0.9 nm Storage layer 17: A CoFeB film with the same composition as the magnetization fixed layer Cap layer 18: A laminated layer having a Ta film with a film thickness of 3 nm, an Ru film with a film thickness of 3 nm, and a Ta film with a film thickness of 3 nm Each layer was selected as above, and a Cu film (which will serve as a work line to be described later) with a film thickness of 100 nm not shown in the drawing was provided between the foundation layer 14 and the silicon substrate.

In the above-described film structure, the ferromagnetic layer of the storage layer 17 had a material of a three-element-based alloy of CoFeB, and a film thickness of the ferromagnetic layer was fixed to 2.0 nm.

Each layer other than the insulating layer 16 formed of the magnesium oxide film was formed using a DC magnetron sputtering method.

The insulating layer 16 formed of the magnesium oxide (MgO) film was formed using an RF magnetron sputtering method.

Furthermore, after each layer of the storage element 3 was formed, heat treatment was performed in a heat treatment furnace in a magnetic field.

Next, after the word line portion was masked by photolithography, a word line (lower electrode) was formed by performing selection etching with Ar plasma for the laminated films in a portion other than the word line.

At that time, etching was performed for the portion other than the word line portion to a depth of 5 nm of the substrate.

After that, a mask of the pattern of the storage element 3 was formed by an electron-beam printing device, and selection etching was performed for the laminated films to form the storage element 3. Etching was performed right above the Cu layer of the word line in the portion other than the storage element 3.

Furthermore, since it is necessary to make a sufficient current flow in the storage element in order to generate spin torque necessary for magnetization reversal of the storage element for characteristics evaluation, it is necessary to suppress a resistance value of the tunnel insulating layer. Thus, the pattern of the storage element 3 was formed in an elliptical shape with a short axis of 0.09 μm and a long axis of 0.18 μm so as to set an area resistance value ($\Omega\mu m^2$) of the storage element 3 to 20 $\Omega\mu m^2$.

Next, the portion other than the storage element 3 was insulated by sputtering of $Al_2O_3$ with a thickness of about 100 nm.

After that, a bit line serving as an upper electrode and a pad for measurement were formed using photolithography.

As such, a sample of the storage element 3 was prepared.

Then, with the above-described manufacturing method, each sample of the storage element 3 was prepared of which compositions of a CoFeB alloy of the ferromagnetic layer of the storage layer 17 was changed.

In the composition of the CoFeB alloy, the composition ratio of CoFe and B (atomic %) was fixed to 80:20, and a composition ratio x (atomic %) of Co in CoFe was changed to 90%, 80%, 70%, 60%, 50%, 40%, 30%, 20%, 10%, and 0%.

For each sample of the prepared storage element 3 above, evaluation of characteristic was performed as below.

Prior to measurement, since it is possible to control values of the positive direction and negative direction of a reversal current to be symmetric, the storage element 3 was configured to receive a magnetic field from outside.

In addition, voltage applied to the storage element 3 was set to be 1V within a range where the insulating layer 16 is not broken.

(Measurement of Saturated Magnetization Amount)

The saturated magnetization amount Ms was measured by VSM measurement using a vibrating sample magnetometer.

(Measurement of Effective Demagnetizing Field)

As a sample for measuring the effective demagnetizing field, a sample was prepared such that each layer constituting the storage element 3 was formed and the layer was formed in a plane pattern of 20 mm×20 mm square, separate from the above-described sample of the storage element 3.

Then, the size of the effective demagnetizing field Meffective was obtained by FMR (Ferromagnetic Resonance) measurement.

A resonant frequency fFMR for an arbitrary external magnetic field Hex, which is obtained by the FMR measurement is obtained with the following Formula (3).

$$f_{FMR} = \gamma' \sqrt{4\pi M_{effective}(H_K + H_{ex})} \qquad \text{Formula (3)}$$

Wherein Meffective in Formula (3) can be expressed by 4πMeffective=4πMs-H⊥ (H⊥ is an anisotropic magnetic field vertical to a film surface).

(Measurement of Reversal Current Value and Thermal Stability)

A reversal current value was measured for the purpose of evaluating a writing characteristic of the storage element 3 by Precedent Example 1.

A current with a pulse width from 10 μs to 100 ms was made to flow in the storage element 3, and then a resistance value of the storage element 3 was measured.

Furthermore, a current value reversing the direction of the magnetization M17 of the storage layer 17 of the storage element 3 was obtained by changing an amount of the current flowing in the storage element 3. A value obtained by extrapolating pulse width dependency of the current value to a pulse width of 1 ns was set to a reversal current value.

In addition, the inclination of the pulse width dependency of the reversal current value corresponds to the above-described index ($\Delta$) of thermal stability of the storage element 3. This means that the reversal current value becomes resilient to disturbance of heat to the extent that the value does not change (the inclination is small) by a pulse width.

In addition, for the consideration of unevenness in storage elements 3, about 20 storage elements 3 having the same structure were prepared, and measurement as above was performed to obtain an average value of reversal current values and the indices $\Delta$ of thermal stability.

Furthermore, reversal current density Jc0 was calculated based on the average value of the reversal current values obtained from the measurement and areas of plane patterns of the storage elements 3.

Table 1 shows compositions of a CoFeB alloy of the storage layer 17, measurement results of saturated magnetization amounts Ms and sizes of the effective demagnetizing field Meffective, and ratios of the saturated magnetization amounts and the sizes of the effective demagnetizing field Meffective/Ms for each sample of the storage elements 3. Herein, the amount of Co of the CoFeB alloy of the storage layer 17 disclosed in Table 1 was indicate by atomic %.

TABLE 1

|  | Ms (emu/cc) | Meffective (emu/cc) | Meffective/Ms |
|---|---|---|---|
| $(Co_{90}Fe_{10})_{80}B_{20}$ | 960 | 1210 | 1.26 |
| $(Co_{80}Fe_{20})_{80}B_{20}$ | 960 | 1010 | 1.05 |
| $(Co_{70}Fe_{30})_{80}B_{20}$ | 1040 | 900 | 0.87 |
| $(Co_{60}Fe_{40})_{80}B_{20}$ | 1200 | 830 | 0.69 |
| $(Co_{50}Fe_{50})_{80}B_{20}$ | 1300 | 690 | 0.53 |
| $(Co_{40}Fe_{60})_{80}B_{20}$ | 1300 | 500 | 0.38 |
| $(Co_{30}Fe_{70})_{80}B_{20}$ | 1260 | 390 | 0.31 |
| $(Co_{20}Fe_{80})_{80}B_{20}$ | 1230 | 360 | 0.29 |
| $(Co_{10}Fe_{90})_{80}B_{20}$ | 1200 | 345 | 0.29 |
| $Fe_{80}B_{20}$ | 1160 | 325 | 0.28 |

In Table 1, when the Co amount x of $(Co_xFe_{100-x})_{80}B_{20}$ is equal to or smaller than 70%, the size of the effective demagnetizing field (Meffective) is smaller than the saturated magnetization amount Ms, in other words, a ratio Meffective/Ms when the Co amount x is equal to or smaller than 70% is a value smaller than 1.0.

Furthermore, it can be recognized that, as the Co amount x becomes smaller, the difference between Meffective and Ms becomes greater.

Figure 4:
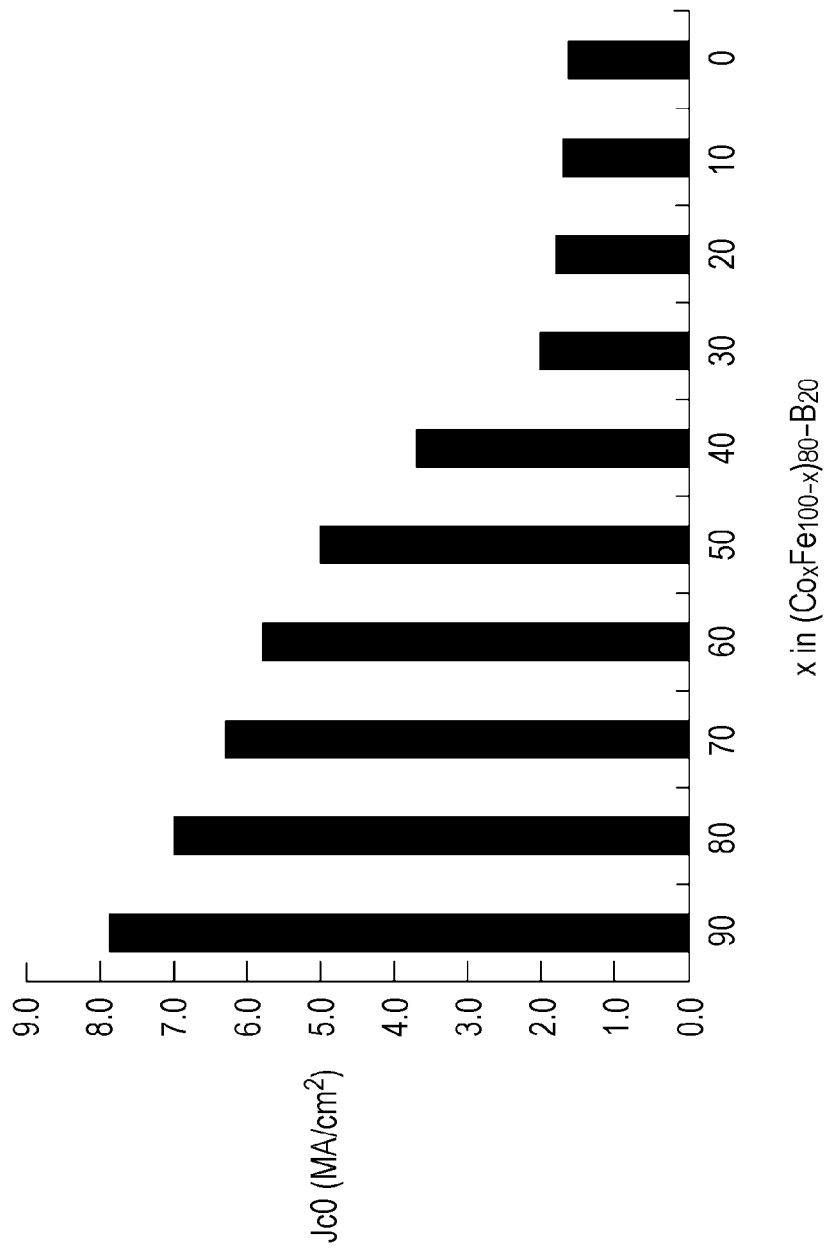
FIG. 4 is a diagram showing the relationship between the amount of Co and reversed current density of a storage layer in the size of 0.09×0.18 μm.
Figure 5:
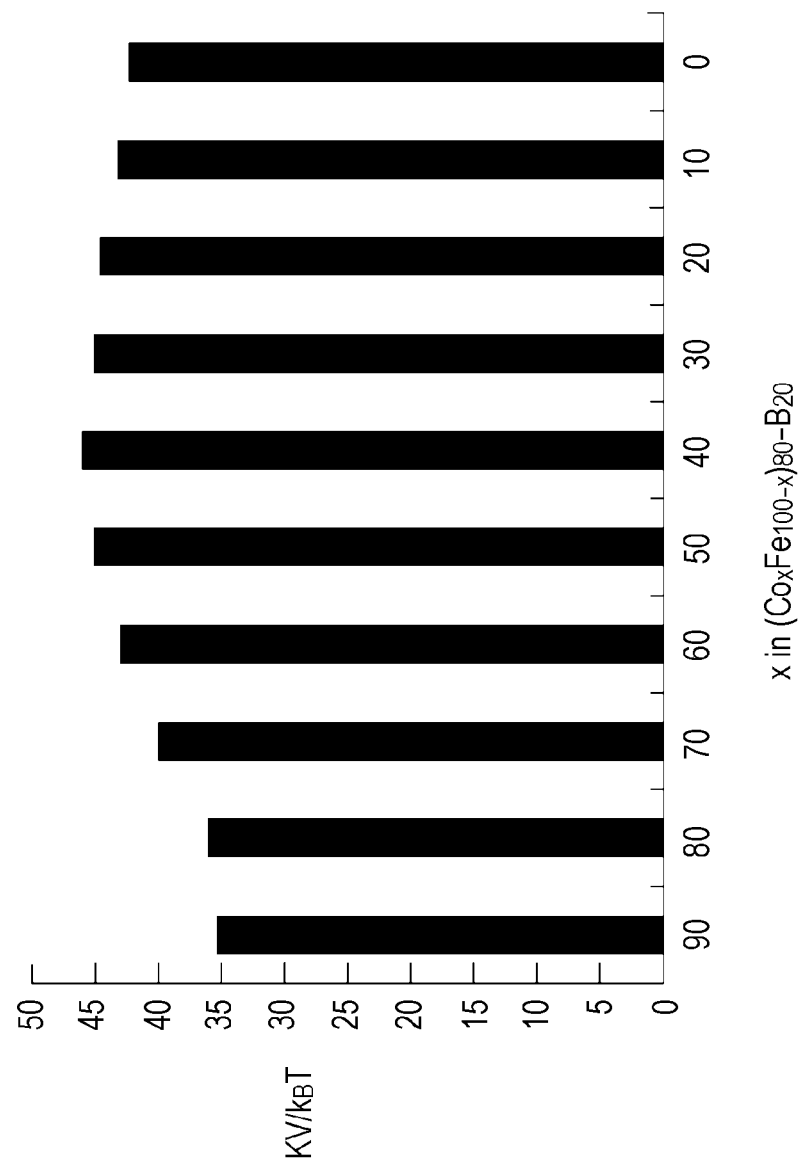
FIG. 5 is a diagram showing the relationship between the amount of Co and the index of thermal stability of the storage layer in the size of 0.09×0.18 μm.

The measurement result of reversal current values is shown in FIG. 4 and the measurement result of indices of thermal stability is shown in FIG. 5.

FIG. 4 shows the relationship between the Co amount x of the CoFeB alloy of the storage layer 17 (content amount in CoFe; atomic %) and reversal current density Jc0 obtained from the reversal current values.

FIG. 5 shows the relationship between the Co amount x of the CoFeB alloy of the storage layer 17 (content amount in CoFe; atomic %) and indices $\Delta$ of thermal stability (KuV/$k_bT$).

From FIG. 4, it is found that, as the Co amount x becomes smaller, the reversal current density Jc0 becomes smaller.

This is because, when the Co amount x becomes smaller, the saturated magnetization amount Ms increases but the effective demagnetizing field Meffective becomes smaller, and thus, a product of both factors (Ms×Meffective) becomes small.

From FIG. 5, it is found that, as the Co amount x becomes smaller, indices $\Delta$ of thermal stability (KuV/$k_bT$) becomes greater, and if the Co amount x is smaller to a certain degree, an index $\Delta$ of thermal stability is stabilized at a great value.

This coincides with a change expected based on the measurement result of the saturated magnetization amounts Ms shown in FIG. 5, and the fact that indices $\Delta$ of thermal stability is proportional to the saturated magnetization amounts Ms based on Formula (2).

From the results in Table 1, and FIGS. 4 and 5, it was clarified that in compositions with Co amount x equal to or lower than 70% where the effective demagnetizing field Meffective is smaller than the saturated magnetization amount Ms, a reversal current value Jc0 can be reduced maintaining high thermal stability, without using a technique of sacrificing thermal stability of lowering Ms.

Experiment 2

In the Experiment 1 described above, it is found that a reversal current value Jc0 can be reduced maintaining high thermal stability in compositions with Co amount x equal to or lower than 70% in the case of $(Co_xFe_{100-x})_{80}B_{20}$.

Thus, in Experiment 2, it was examined what kind of influence a B amount z have on a ratio of Co and Fe and Meffective/Ms, using the storage layer 17 with compositions of $(Co_{70}Fe_{30})_{80}B_z$ and $(Co_{80}Fe_{20})_{80}B_z$. Details of samples are the same as those in Experiment 1.

Table 2 show that compositions of a CoFeB alloy setting a B amount z (atomic %) to 5 to 40% in $(Co_{70}Fe_{30})_{100-z}B_z$, measurement results of saturated magnetization amounts Ms and sizes of effective demagnetizing fields Meffective, and ratios of the saturated magnetization amounts and the sizes of effective demagnetizing field Meffective/Ms.

In addition, Table 3 shows compositions of a CoFeB alloy setting a B amount z (atomic %) to 5 to 40% in $(Co_{80}Fe_{20})_{100-z}B_z$, saturated magnetization amounts Ms, sizes of effective demagnetizing fields Meffective, and ratios of Meffective/Ms, in the same manner.

TABLE 2

|  | Ms (emu/cc) | Meffective (emu/cc) | Meffective/Ms |
|---|---|---|---|
| $(Co_{70}Fe_{30})_{95}B_5$ | 1310 | 1090 | 0.83 |
| $(Co_{70}Fe_{30})_{90}B_{10}$ | 1250 | 1080 | 0.89 |
| $(Co_{70}Fe_{30})_{80}B_{20}$ | 1040 | 900 | 0.87 |
| $(Co_{70}Fe_{30})_{70}B_{30}$ | 820 | 730 | 0.89 |
| $(Co_{70}Fe_{30})_{60}B_{40}$ | 450 | 690 | 1.53 |

TABLE 3

|  | Ms (emu/cc) | Meffective (emu/cc) | Meffective/Ms |
|---|---|---|---|
| $(Co_{80}Fe_{20})_{95}B_5$ | 1250 | 1280 | 1.02 |
| $(Co_{80}Fe_{20})_{90}B_{10}$ | 1100 | 1140 | 1.04 |
| $(Co_{80}Fe_{20})_{80}B_{20}$ | 960 | 1010 | 1.05 |
| $(Co_{80}Fe_{20})_{70}B_{30}$ | 750 | 890 | 1.19 |
| $(Co_{80}Fe_{20})_{60}B_{40}$ | 430 | 690 | 1.60 |

From the results of Table 2, it can be recognized that, when a ratio of Co and Fe is fixed to 70 to 30 as $(Co_{70}Fe_{30})_{100-z}B_z$, the sizes of the effective demagnetizing field Meffective become smaller than the saturate magnetization amounts Ms in compositions other than B amount z=40 atomic %.

From the results of Table 3, it can be recognized that, when a ratio of Co and Fe is fixed to 80 to 20 as $(Co_{80}Fe_{20})_{100-z}B_z$, the sizes of the effective demagnetizing field Meffective become greater than the saturate magnetization amounts Ms in all compositions.

From the results of Tables 1 to 3 described above, it was clarified that, if a B amount z is in a range of being equal to or lower than 30 atomic %, the relationship of sizes of a saturated magnetization amount Ms and an effective demagnetizing field Meffective is determined by a ratio of Co and Fe.

Therefore, a composition of a CoFeB alloy where the size of the effective demagnetizing field Meffective is smaller than a saturated magnetization amount Ms of the storage layer 17 is as follows:

$(Co_xFe_y)_{100-z}B_z$ in ranges of
$0 \leq Co_x \leq 70$,
$30 \leq Fe_y \leq 100$, and
$0 < B_z \leq 30$.

Experiment 3

In a Gbit-class spin injection type magnetization reversal memory, it is assumed that a size of a storage element is equal to or smaller than 100 nmφ. Thus, in Experiment 3, thermal stability was evaluated using a storage element in a size of 50 nmφ.

In a composition of a CoFeB alloy, a composition ratio (atomic %) between CoFe and B was fixed to 80 to 20, and a composition ratio x of Co in CoFe (atomic %) was changed to 90%, 80%, 70%, 60%, 50%, 40%, 30%, 20%, 10%, and 0%.

Details of the samples other than the size of the element is the same as those in Experiment 1.

Figure 6:
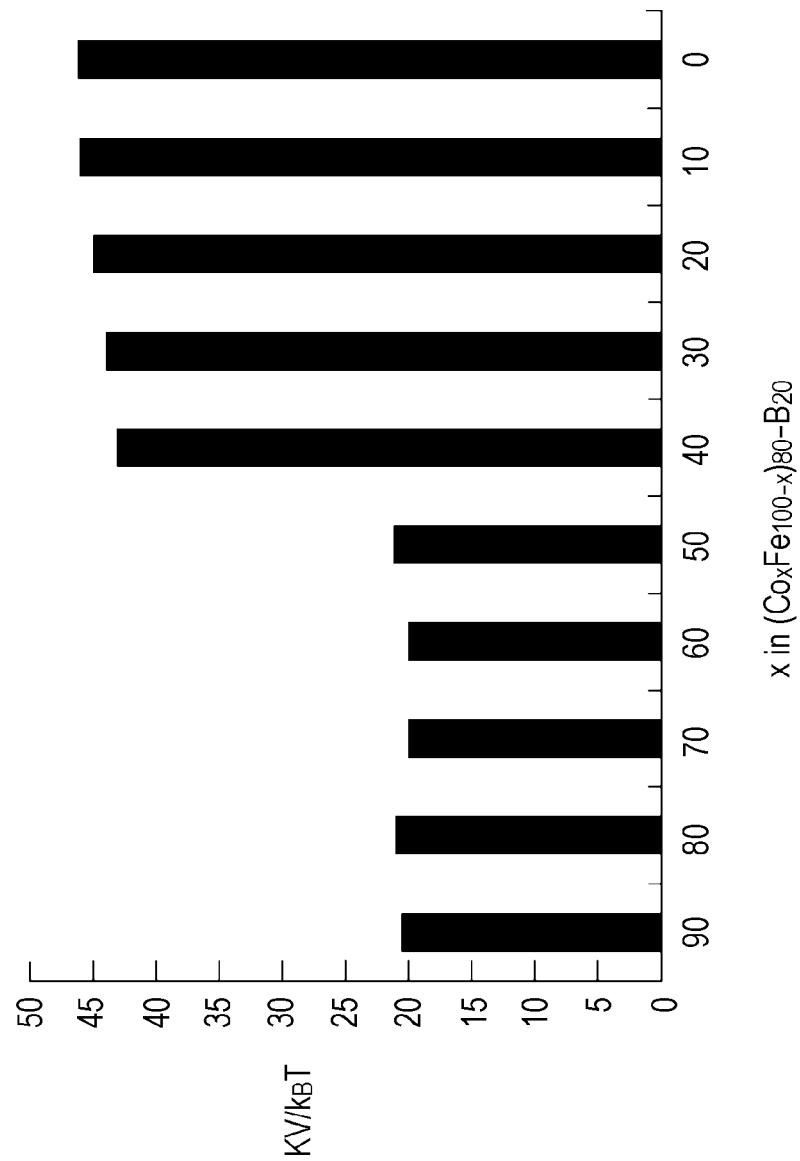
FIG. 6 is a diagram showing the relationship between the amount of Co and the index of thermal stability of a storage layer in the size of 50 nmφ.

FIG. 6 shows the relationship between Co amounts of the CoFeB alloy (content amount in CoFe; atomic %) and indices Δ of thermal stability ($KuV/k_bT$) when the size of the storage element 3 is 50 nmφ.

From FIG. 6, it is found that CoFeB alloy composition dependency of an index Δ of thermal stability have significantly changed from CoFeB alloy composition dependency obtained in an elliptical storage element with a short axis of 0.09 μm×a long axis of 0.18 μm shown in FIG. 4, with the element size of 50 nmφ.

According to FIG. 6, high thermal stability is maintained only in cases where 60% or higher atomic % of Fe is present in a CoFeB alloy composition.

As a result of much examination, it was clarified that the reason of showing a high index Δ of thermal stability by the CoFeB alloy having 600 or higher atomic % of Fe in a submicroscopic storage element is attributable to magnetization of the CoFeB alloy in the film surface vertical direction.

It is thought that the reason of the magnetization of the CoFeB alloy in the film surface vertical direction is in a composition where the size of the effective demagnetizing field Meffective is remarkably smaller than the saturated magnetization amount Ms.

In addition, the reason of maintain thermal stability also in a submicroscopic element with a vertical magnetization film is in the relationship of Hk (effective anisotropic field) in Formula (2), and Hk of the vertical magnetization film generally has a far higher value than that of an in-plane magnetization film. In other words, with an effect of high Hk, a high index Δ of thermal stability can be maintained in the vertical magnetization film even in a submicroscopic element which would not secure a sufficient index Δ of thermal stability if it has the in-plan magnetization film.

From the experiment results, when $Fe_{100-x}$ is equal to or hither than 60%, in the CoFeB alloy with a composition of $(Co_xFe_{100-x})_{80}B_{20}$, the composition can be preferably applied to a Gbit-class memory device using spin injection.

Experiment 4

The above-described Experiment 3 shows that, when the amount of Fe is equal to or hither than 60%, in the CoFeB alloy with a composition of $(Co_xFe_{100-x})_{80}B_{20}$, the composition can be preferably applied to a Gbit-class memory device using spin injection. Further in Experiment 4, a storage element in a size of 50 nmφ was manufacture with a CoFeB alloy having a B amount in a range of 5 to 30 atomic %, and thermal stability thereof was evaluated.

Details of the samples other than the element size are the same as those in Experiment 1.

Table 4 shows the relationship between a CoFeB alloy with compositions of $(Co_xFe_{100-x})_{100-z}B_z$ in the range of a Co amount x=50, 40, 30, 20, 10, 0 and a B amount z=5, 10, 20, 30 and indices Δ of thermal stability ($KuV/k_BT$).

TABLE 4

|  | $(Co_{50}Fe_{50})_{100-z}B_z$ | $(Co_{40}Fe_{60})_{100-z}B_z$ | $(Co_{30}Fe_{70})_{100-z}B_z$ | $(Co_{20}Fe_{80})_{100-z}B_z$ | $(Co_{10}Fe_{90})_{100-z}B_z$ | $Fe_{100-z}B_z$ |
|---|---|---|---|---|---|---|
| $B_z$ = 5 Atom % | 19 | 40 | 42 | 42 | 43 | 44 |
| $B_z$ = 10 Atom % | 20 | 41.5 | 43 | 44 | 44 | 45 |
| $B_z$ = 20 Atom % | 20 | 43 | 44 | 45 | 46 | 46 |
| $B_z$ = 30 Atom % | 21 | 45 | 47 | 48 | 48 | 48 |

From Table 4, it is found that indices Δ of thermal stability are highly maintained in all compositions excluding cases where a Co amount x=50 and a B amount z=5 to 30.

In other words, as in the results of Experiment 4, it was clarified that Co amount x=50 and 60 are boundary lines when a submicroscopic element corresponding to a Gbit-class spin injection type magnetization reversal memory secures high thermal stability.

Therefore, from the above-described results, it was proved that, when a composition of a CoFeB alloy of the storage layer 17 is $(Co_xFe_{100-x})_{100-z}B_z$ in ranges of:
$0 \leq Co_x \leq 40$,
$60 \leq Fe_y \leq 100$, and
$0 < B_z \leq 30$
the composition is preferable for manufacturing a Gbit-class spin injection type magnetization reversal memory.

Furthermore, in the CoFeB alloy having a composition of a high Fe ratio between Co and Fe, the gap between the effective demagnetizing field Meffective and the saturated magnetization amount Ms is large and vertical magnetization is easily implemented, and therefore, thermal stability is secured with ease.

For this reason, when the capacity of a magnetic memory increases and a size of the storage element 3 is smaller, a CoFeB alloy having a large amount of Fe secures thermal stability with ease.

Thus, for example, when a state is considered in which a Gbit-class spin injection type magnetization reversal memory can be realized with the storage layer 17 having a $Fe_y$ of 60 atomic % and a size of 70 nmφ, it is desirable that the Fe amount y in the CoFeB alloy increase by 5 every time the diameter of the storage element 3 decreases by 5 nmφ.

For example, in the above-described case of $(Co_xFe_y)_{100-z}B_z$, a composition with the Fe amount y of 65%, 70%, 75%, 80%, . . . as the content amount in CoFe (35%, 30%, 25%, 20%, . . . in the case of the Co amount x) is a preferable example according to reduction in the size of the storage element.

[1-4. Configuration of Precedent Example 2]

Subsequently, Precedent Example 2 will be described. Since configuration examples of a memory device and storage element 3 of Precedent Example 2 are the same as those in FIGS. 1 and 2, overlapping description thereof will not be repeated.

This Precedent Example 2 uses CoFeB as the storage layer 17 and the magnetization fixed layer 15, the same as that of Precedent Example 1, but the composition of CoFeB is $(Co_xFe_y)_{100-z}B_z$ in ranges of $0 \leq Co_x \leq 40$, $60 \leq Fe_y \leq 100$, and $20 < B_z \leq 40$.

When it comes to considering of manufacturing the spin injection type magnetization reversal memory as a semiconductor device, it is desired that a magnetic material constituting the storage element 3 exhibits excellent characteristics in a range of temperature acceptable for a semiconductor process.

For example, since thermal load applied to the semiconductor process performed for an Si substrate until it becomes a chip after passing through all processes is equal to or higher than 350° C., considering the fact, it is necessary for the magnetic material constituting the storage element 3 to exhibit excellent characteristics even after it undergoes heat treatment at a temperature of equal to or higher than 350° C.

On the other hand, characteristics of a transistor necessary for operating the memory device generally deteriorates when it is exposed to a high temperature of being, for example, equal to or higher than 450° C. For this reason, a magnetic material showing characteristics in a state of being heated at a high temperature of 450° C., 500° C., or the like is also not appropriate.

Therefore, when it comes to considering of manufacturing the spin injection type magnetization reversal memory, it is necessary for the magnetic material constituting the storage element 3 to show its favorable characteristics in a temperature range of equal to or higher than 350° C. and lower than 450° C.

When it comes to considering in terms of affinity between a semiconductor process and heat, since magnetic force and a TMR characteristic of a general vertical magnetization material deteriorate at high temperature of equal to or higher than 250° C., or magnetic characteristic thereof mostly appears at high temperature of equal to or higher than 500° C., a vertical magnetization film is difficult to handle.

However, the vertical magnetization film is appropriate for large capacity and low power consumption as described above. Therefore, it is important to develop a vertical magnetization film for a spin injection type magnetization reversal memory showing characteristics of a low reversal current and a high output under heat treatment conditions with high affinity with the semiconductor process.

Thus, Precedent Example 2 is based on recognition that, in a memory device using the storage element 3 having vertical magnetization anisotropy appropriate for large capacity and low power consumption as described above, it is necessary to secure a high magneto-resistance change rate in a heat treatment temperature range of being equal to or higher than 350° C. and lower than 450° C.

It is desirable that a vertical magnetization type be adopted so as to lower a current for storage as described above. In addition, since the vertical magnetization film generally can hold high magnetic anisotropy than an in-plane magnetization film, the vertical magnetization film is preferable in terms of maintaining a high index Δ of thermal stability described above.

There are several kinds of magnetic materials having vertical anisotropy including a rear earth-transition metal alloy (TbCoFe, or the like), a metallic multilayer film (Co/Pd multilayer film, or the like), a regular alloy (FePt, or the like), a material using interfacial anisotropy between an oxide and a magnetic metal (Co/MgO, or the like). However, since the rear earth-transition metal alloy loses vertical magnetic anisotropy when the alloy is diffused or crystallized by heating, the alloy is not preferable as a material for the spin injection type magnetization reversal memory. In addition, since it is disclosed that a metallic multilayer film also is diffused by heating thereby impairing vertical magnetic anisotropy, and (111) orientation of face-centered cubic is adopted to exhibit vertical magnetic anisotropy, it is difficult to realize (001) orientation necessary for a high polarizability layer such as MgO or Fe, CoFe, CoFeB, or the like disposed adjacent thereto.

An L10 regular alloy is stable at a high temperature, and shows vertical magnetic anisotropy in (001) orientation, and thus, the problems described above do not occur, but it is necessary for the alloy to regularly array atoms thereof by heating to a sufficiently high temperature of equal to or higher than 500° C. during the manufacture, or by performing heat treatment at a high temperature of equal to or higher than 500° C. after the manufacture, and the alloy has low affinity with a semiconductor process. In addition, there is a possibility of an increase in diffusion or interfacial roughness occurs which are not preferable to other portions of the laminated layers such as a tunnel barrier.

On the contrary, a material using interfacial magnetic anisotropy, that is, a material laminated with a Co-based or a Fe-based material on MgO that is a tunnel barrier does not easily have any problems described above, and for this reason, the material is promising as a material for a storage layer of a spin injection type magnetization reversal memory.

Therefore, as a result of much examination by the inventors of this application, it is found out that, in a case of a magnetic material constituted by CoFeB having a composition $(Co_xFe_y)_{100-z}B_z$ in the ranges of $0 \leq Co_x \leq 40$, $60 \leq Fe_y \leq 100$, and $20 < B_z \leq 40$, a spin polarizability P in a formula expressing the reversal current can be highly maintained even in a state of a heat treatment temperature of equal to or higher than 350° C.

A high-output element has a high spin polarizability P, and therefore, low reversal current is also possible according to Precedent Example 2 above.

Furthermore, by using a vertical magnetization material having high magnetic anisotropy, it is possible to provide a spin injection type magnetization reversal element (storage element 3) with high output and low power consumption, without sacrificing thermal stability.

The configurations of the memory device and the storage element 3 in Precedent Example 2 are the same as those in FIGS. 1 and 2, but the storage layer 17 of the storage element 3 employs the above-described composition.

In other words, according to the storage element of Precedent Example 2, the storage layer 17 holding information in a magnetized state of a magnetic body is included, and for the storage layer 17, the magnetization fixed layer 15 is provided via the insulating layer 16 that is an intermediate layer. In addition, by injecting electrons spin-polarized in the laminating direction, the direction of magnetization of the storage layer 17 magnetized in the film surface vertical direction changes, whereby recording of information on the storage layer 17 is performed. Herein, by using CoFeB of the composition as a ferromagnetic layer material constituting the storage layer 17, it is possible to obtain characteristics of a high tunnel magneto-resistive effect and a low reversal current even in high-heat treatment.

Accordingly, magnetization reversal with a high output and a low current is possible even in high-heat treatment.

In addition, the memory device using the storage element 3 can perform recording of information such that a current is made to flow in the storage element 3 in the laminating direction through two kinds of lines (lines 1 and 6 in FIG. 1) to bring about spin transfer, and a current is made to flow in the storage element 3 in the laminating direction through two kinds of lines to bring about spin torque magnetization reversal.

Since the characteristics of an operation with a high output and a low current are obtained even in high-heat treatment in Precedent Example 2 as above, it is possible to configure the storage element 3 excellent in balancing the characteristics.

In addition, since a vertical magnetization film having high magnetic anisotropy is used, thermal stability of information does not deteriorate.

Accordingly, it is possible to obtain a sufficient operation margin of the storage element 3 and to stably operate the storage element 3, eliminating operation errors.

In addition, since the material exhibits excellent characteristics in high-heat treatment of which temperature range is equal to or higher than 350° C. and lower than 450° C., affinity with a semiconductor process is high.

In addition, it is possible to reduce power consumption of the storage element as the writing current for the storage element 3 is reduced.

Therefore, it is possible to reduce power consumption of the entire memory of which the memory cell is constituted by the storage element 3 of Precedent Example 2.

Therefore, it is possible to realize a memory which is stably operated with high reliability.

In addition, the memory having the storage element 3 shown in FIG. 2 and the configuration shown in FIG. 1 has an advantage that a general semiconductor MOS forming process can be applied thereto when the memory is manufactured.

Thus, the memory of this example can be applied as a general-purpose memory.

Furthermore, the magnetization fixed layer 15 may employ the above-described composition of CoFeB.

In addition, even in Precedent Example 2, when a magnesium oxide is used for the insulating layer 16 that is an intermediate layer, a magneto-resistance change rate (MR ratio) can be raised.

By improving efficiency of spin injection with a raised MR ratio, it is possible to further lower current density necessary for reversing the direction of the magnetization M17 of the storage layer 17.

In addition, the storage element 3 can be manufactured such that layers form the foundation layer 14 to the cap layer 18 are successively formed in a vacuum device, and then a pattern of the storage element 3 is formed by processing such as etching, or the like.

[1-5. Experiment Regarding Precedent Example 2]

Herein, in the configuration of the storage element 3 as a precedent example, specifically, a material of the ferromagnetic layer constituting the storage layer 17 was selected and the characteristic of the storage element 3 was examined.

In the same manner as in the above-described Experiment 1 to Experiment 4, examination was performed for a wafer formed only with the storage element 3, for the purpose of investigating a magnetization reversal characteristic of the storage layer 17.

Experiment 5

Figure 7:
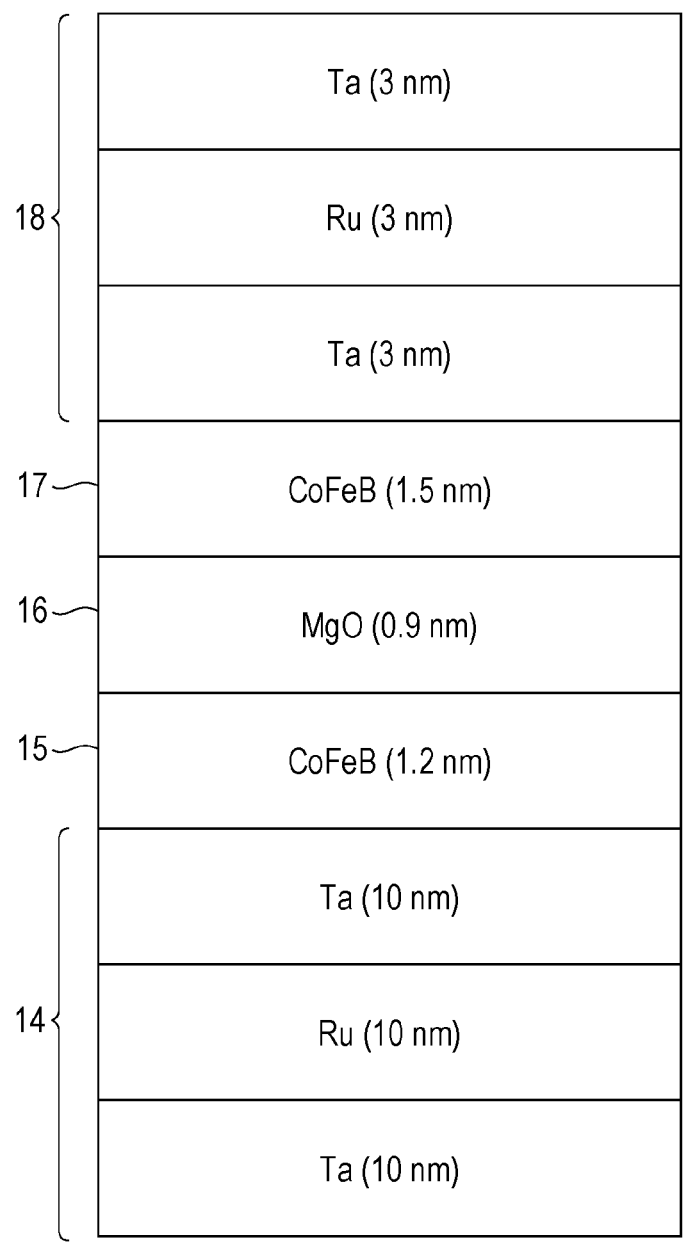
FIG. 7 is an illustrative diagram of a layer structure of a sample of a storage element used in the experiment of Precedent Example 2.

A thermally-oxidized film with a thickness of 300 nm was formed on a silicon substrate with a thickness of 0.725 mm, and the storage element 3 with the structure shown in FIG. 2 was formed thereon as shown in FIG. 7.

Foundation layer 14: A laminated layer including a Ta film with a film thickness of 10 nm, an Ru film with a film thickness of 10 nm, and a Ta film with a film thickness of 10 nm Magnetization fixed layer 15: CoFeB film with a film thickness of 1.2 nm Tunnel insulating layer 16: Magnesium oxide film with a film thickness of 0.9 nm Storage layer 17: CoFeB film with the same composition as the magnetization fixed layer Cap layer 18: A laminated layer including a Ta film with a film thickness of 3 nm, an Ru film with a film thickness of 3 nm, and a Ta film with a film thickness of 3 nm Each layer is selected as above, and a Cu film (which will serve as a word line to be described later) with a film thickness of 100 nm, not shown in the drawing, was provided between the foundation film 14 and the silicon substrate to complete the formation of each layer.

In the above-described film structure, the ferromagnetic layer of the storage layer 17 had a material of a three-element-based alloy of CoFeB, and a film thickness of the ferromagnetic layer was fixed to 1.5 nm.

Each layer other than the insulating layer 16 formed of the magnesium oxide film was formed using a DC magnetron sputtering method.

The insulating layer 16 formed of the magnesium oxide (MgO) film was formed using an RF magnetron sputtering method.

Furthermore, after each layer of the storage element 3 was formed, heat treatment was performed in a heat treatment furnace in the magnetic field for one hour at various temperatures.

Next, after the word line portion was masked by photolithography, a word line (lower electrode) was formed by performing selection etching with Ar plasma for the laminated films in a portion other than the word line. At this time, the portion other than the word line underwent etching to a depth of the substrate of 5 nm.

After that, a mask of the pattern of the storage element 3 was formed by an electron-beam printing device, and selection etching was performed for the laminated films to form the storage element 3. Etching was performed right above a Cu layer of the word line in a portion other than the storage element 3.

Furthermore, since it is necessary to make a sufficient current flow in the storage element in order to generate spin torque necessary for magnetization reversal of the storage element for characteristics evaluation, it is necessary to suppress a resistance value of the tunnel insulating layer. Thus, the pattern of the storage element 3 was formed in an elliptical shape with a short axis of 0.09 μm and a long axis of 0.09 μm so as to set an area resistance value ($\Omega\mu m^2$) of the storage element 3 to 20 $\Omega\mu m^2$.

Next, the portion other than the storage element 3 was insulated by sputtering of $Al_2O_3$ with a thickness of about 100 nm.

After that, a bit line serving as an upper electrode and a pad for measurement were formed using photolithography.

As such, a sample of the storage element 3 was prepared.

Then, with the above-described manufacturing method, each sample of the storage element 3 was prepared of which compositions of a CoFeB alloy of the ferromagnetic layer of the storage layer 17 was changed.

In the composition of the CoFeB alloy, the composition ratio of Co and Fe (atomic %) was fixed to 20:80, and a composition ratio z (atomic %) of B was changed to 10%, 20%, 30%, 35%, 40%, and 50%.

As above, evaluation of characteristics of each prepared sample of the storage element 3 was performed as below.
(Measurement of TMR)

Measurement of TMR was performed for the purpose of evaluating an output characteristic of the storage element of precedent examples.

100 mV of voltage was applied to the storage element 3 while sweeping a magnetic field in the range of 3 kOe to measure a resistance value of the storage element 3.

Then, considering unevenness among storage elements 3, about 20 storage elements 3 with the same structure were prepared, and then measurement as above was performed to obtain an average value of characteristics.

Figure 8:
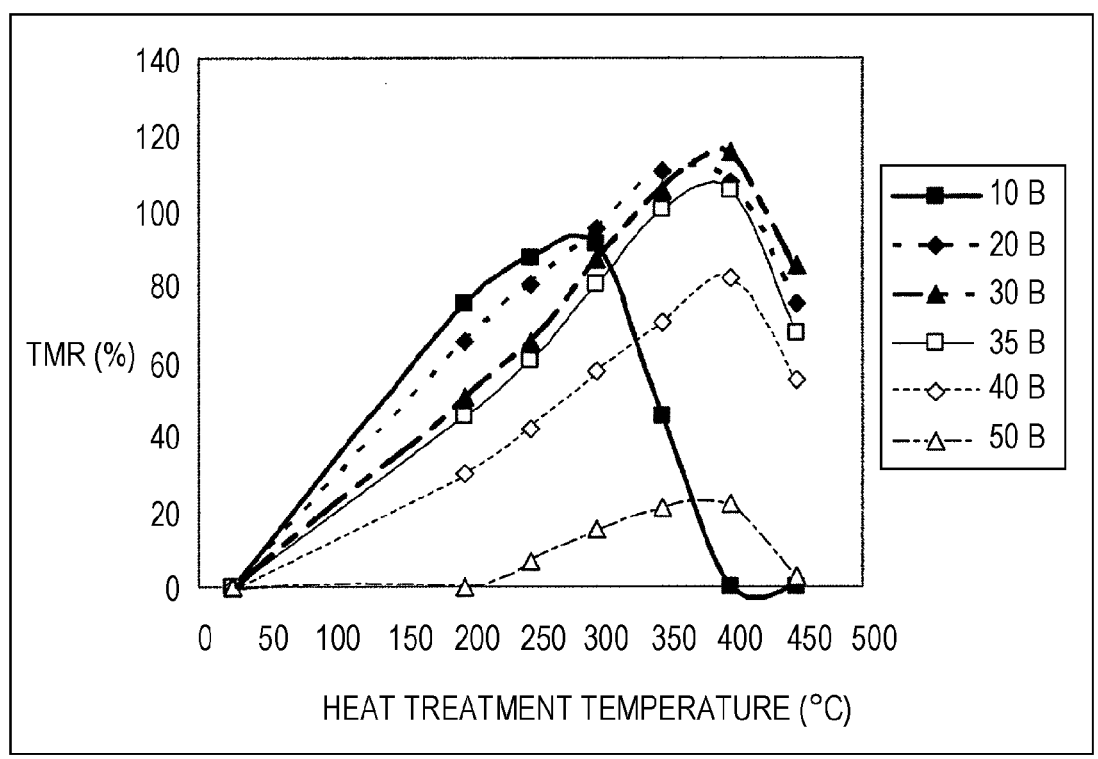
FIG. 8 is a diagram showing heat-treatment temperature dependency of a TMR for each composition of CoFeB of a storage layer of a precedent example.

FIG. 8 shows heat treatment temperature dependency of TMR for each composition of the CoFeB alloy of the storage layer 17 for each sample of the storage element 3.

From FIG. 8, it is found out that, when the concentration of B is 10% (10B in the drawing), the TMR forms a peak in the vicinity of heat treatment temperature of 300° C.

On the other hand, when the concentration of B is in a composition range of 20% to 40% (20B to 40B in the drawing), the peak of the TMR are shifted in the vicinity of heat treatment temperature of 350° C. to 400° C.

In addition, it is found out that, when the concentration of B is 50% (50B in the drawing), if the heat treatment is performed at temperature equal to or higher than 200° C., TMR is observed, but an absolute value of the TMR becomes extremely small in comparison to a CoFeB alloy in other compositions.

When the concentration of B is 40%, the TMR remains at a slightly small level in comparison to the maximum TMR (about 110%) of a sample of which the concentration of B is 10% to 35%, but about 80% of TMR is secured in the vicinity of heat treatment temperature of 350° C. to 400° C., which is equivalent to an output adoptable to a spin injection type magnetization reversal memory.

In addition, in a case of a sample of which the concentration of B is 20% to 30%, sufficient TMR is secured even in the vicinity of 450° C.

In conclusion, it can be ascertain that, when the concentration of B is in a composition range of 20% to 40$, the most preferable TMR characteristic are obtained in a heat treatment range optimum for a semiconductor process.

Generally, when tunnel magnetic junction is made using a CoFeB alloy, it is disclosed that B subjected to heat treatment diffuses to a MgO barrier (insulating layer 16) or the cap layer 18 side. The reason that the concentration of B is preferably 20% to 40% in heat treatment temperature range of 350° C. to 400° C. is related to the diffusion of B, and is assumed that, by putting a certain amount of B in an alloy film as an initial composition of the CoFeB alloy, distribution of B is realized from which excellent vertical magnetic characteristic and TMR characteristic are obtained in a desired heat treatment temperature range, and accordingly, interfacial magnetic anisotropy of the MgO barrier and the CoFeB alloy is reinforced.

According to the assumption, the concentration of B exits from which excellent TMR characteristic are obtained even in a high-heat treatment of which temperature is equal to or higher than 450° C., but in a case of the samples used in this experiment, roughness of the foundation layer 14 is intensified and excessive diffusion of the foundation layer 14 and the cap layer 18 was brought about in heat treatment at over 450° C., and therefore, it is considered that the TMR characteristic deteriorate in CoFeB with all levels of the concentration of B.

Deterioration of the TMR characteristic at a high temperature of equal to or higher than 350° C. when the concentration of B is 10% is attributable to the fact that, since the concentration of B is excessively smaller when heat treatment is performed at a high temperature, it is difficult to reinforce the interfacial magnetic anisotropy between the MgO barrier and the CoFeB alloy.

In addition, the cause that a favorable TMR characteristic is not obtained when the concentration of B is 50% is presumed that saturated magnetization is extremely lowered due to excessively high concentration of B.

From the result above, when the CoFeB alloy in which the composition ratio (atomic %) of Co and Fe is fixed to 20:80, it was verified that the storage element 3 with a high output can be made with the concentration of B of 20% to 40% and heat treatment temperature ranging from 350° C. to 450° C.
Experiment 6

Experiment 5 described above showed detailed experiment results when the concentration of B was changed at a specific Co/Fe ratio. Next, in Experiment 6, the C/Fe ratio was set to 40/60, 30/70, and 10/90, and the concentration of B was changed to 20%, 30%, and 40% to make the storage element 3, and the TMR characteristic was evaluated.

Figure 9C:
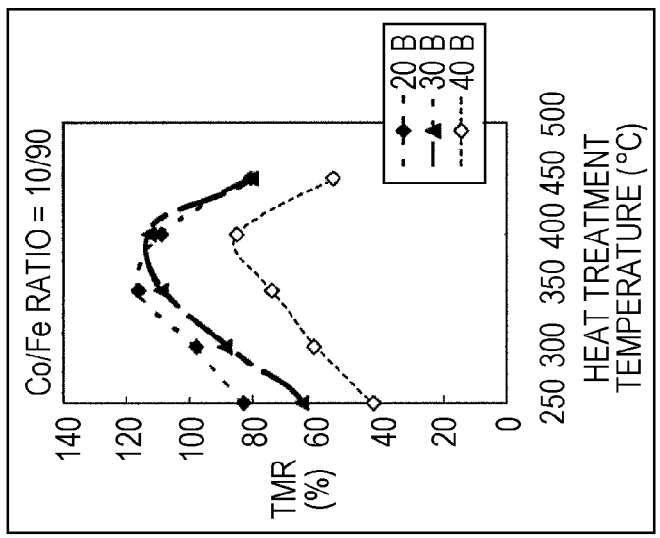
FIGS. 9A to 9C are diagrams showing measurement results of TMR features when B concentration and heat-treatment temperature are changed with a Co/Fe ratio in regard to CoFeB of the storage layer of the precedent example.
Figure 9B:
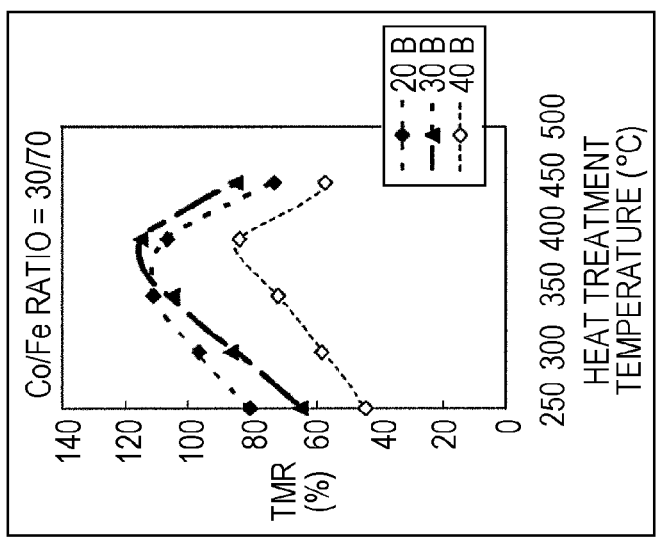
Figure 9A:
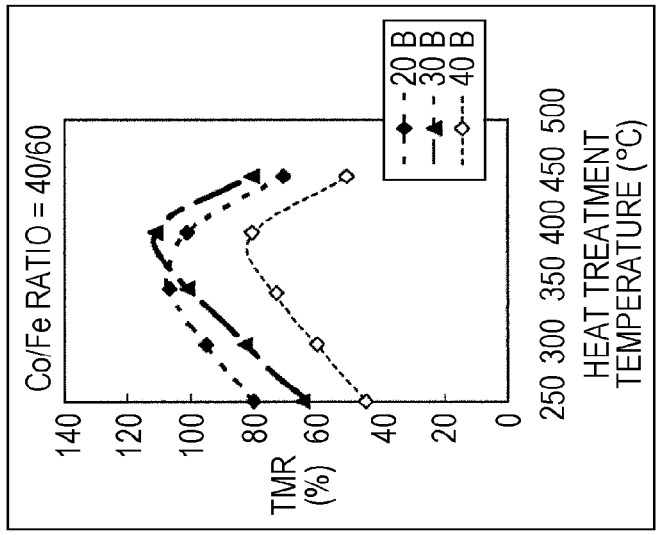

FIGS. 9A to 9C show the TMR characteristic when the concentration of B and heat treatment temperature are changed at each Co/Fe ratio.

As understood from the results, the characteristic with a high output (high TMR) is obtained in the concentration of B of 20% to 40% and heat treatment temperature range of 350° C. to 400° C. shown in Experiment 5 in all compositions.

In addition, a composition with a high output (high TMR) is also observed even in the vicinity of 450° C. For example, it is a composition with the concentration of B ranging from 20% to 30%.

In addition, for a value of TMR, high dependency on a Co/Fe ratio is not observed.

The results of Experiment 5 and Experiment 6 above show that, in the ≤composition ranges of $0 \leq Co_x \leq 40$, $60 \leq Fe_y \leq 100$, $20 < B_z \leq 40$, it is possible to provide a storage element with a high output having high affinity with a semiconductor process in the heat treatment temperature ranging from 350° C. to 400° C., by using CoFeB for a vertical magnetization ferromagnetic material valid for $(Co_xFe_y)_{100-z}B_z$.

In addition, a high spin polarization rate P is also realized by the realization of the high output, whereby low power consumption is also possible.

As such, it is possible to provide a spin injection type magnetization reversal element with a high output and low reversal current, by utilizing magnetic anisotropy with high vertical magnetization, without using a technique of sacrificing thermal stability.

Furthermore, in the above-described Precedent Example 1, it was described that the effective demagnetizing field Meffective is smaller than the saturated magnetization amount Ms in the concentration range of B of $0 < B_z \leq 30$, thereby being preferable for vertical magnetization (refer to, for example, Table 2 above). In regard to that, the concentration of B in Precedent Example 2 was set to $20 < B_z \leq 40$, and then the range of 30% to 40% seems not to be appropriate for vertical magnetization.

However, it was understood that, when heat treatment is performed at a relatively high temperature, the effective demagnetizing field Meffective is smaller than the saturated magnetization amount Ms also in the concentration range of B of 30% to 40%, thereby being appropriate for vertical magnetization.

Table 5 shows the saturated magnetization amount Ms and the effective demagnetizing field Meffective of the storage elements whose composition of CoFeB is $(Co_{70}Fe_{30})_{65}B_{35}$ and $(Co_{70}Fe_{30})_{60}B_{40}$, and the storage elements were subjected to a heat treatment at 400° C.

TABLE 5

|  | Ms (emu/cc) | Meffective (emu/cc) | Meffective/Ms |
|---|---|---|---|
| $(Co_{70}Fe_{30})_{65}B_{35}$ | 740 | 650 | 0.88 |
| $(Co_{70}Fe_{30})_{60}B_{40}$ | 720 | 550 | 0.89 |

In both cases where the concentration of B is 35% and 40%, the effective demagnetizing field Meffective is smaller than the saturated magnetization amount Ms (Meffective/Ms<1).

In other words, the condition is satisfied that, when the heat treatment temperature is high, the size of the effective demagnetizing field that the storage layer 17 receives is smaller than that saturated magnetization amount of the storage layer 17 even in the concentration range of B of 30% to 40%.

<2. Storage Element of Embodiment>

[2-1. Regarding Problem of Precedent Example]

Precedent examples have dealt with realization of a preferable storage element in terms of a reduction in a writing current amount and thermal stability by using the CoFeB alloy as the ferromagnetic material of the storage layer 17, and setting the composition thereof to a predetermined ratio.

However, when the CoFeB alloy is used as above, a relatively large amount of Fe comes to be included in the composition of the ferromagnetic material of the storage layer 17.

Due to the foregoing matter, an increase in resistance is promoted caused by oxidation and corrosion in processing damage and/or high-temperature heating during the manufacturing process of a magnetic memory.

Particularly, in a high-density storage element in which it is necessary to have a fine element diameter of equal to or smaller than 100 nm, it is difficult to ignore a rise in resistance caused by erosion from the outer circumference portion to the magnetic layer. According to processing methods, there is also a method in which etching is stopped right above the MgO tunnel barrier film to protect the magnetization fixed layer in the lower part, but the magnetic body is exposed for the storage layer in the upper part without change.

It is desirable for the embodiment of the disclosure to propose a relatively easy method of reinforcing anti-corrosion of the storage layer and preventing a rise in resistance thereof during microfabrication, and to provide an ST-MRAM element which enables stable recording with a low current.

Figure 10:
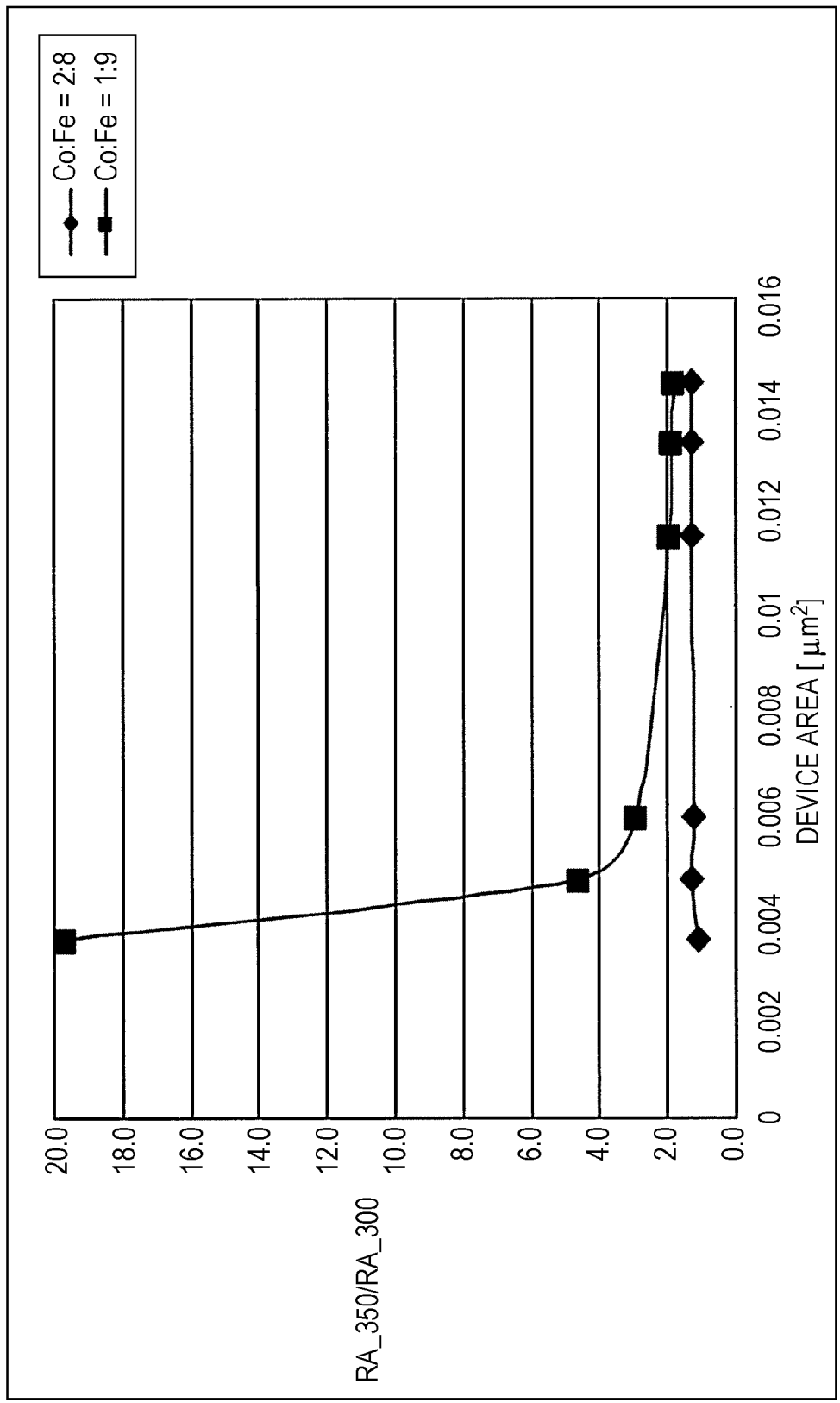
FIG. 10 is a diagram showing the RA ratio of heat-treatment temperatures of 300° C. and 350° C. for an element size in the precedent example.

Herein, in order to check out the problem of the precedent examples according to the above description, FIG. 10 shows a diagram plotting resistance areas (RA) for the area of the storage element.

Specifically, FIG. 10 shows comparison of changed ratios between Co and Fe, when the storage layer 17 has [CoFe]: B=80:20.

Furthermore, the horizontal axis represents an element area (μm$^2$), and the vertical axis represents a ratio of RA when heat treatment was performed at 350° C. to RA when heat treatment was performed at 300° C. and (RA_350/RA_300).

As shown in FIG. 10, in a CoFeB composition including more Fe, a rise in a resistance value accompanying a reduction in the element size is noticeable when the heat treatment temperature is raised, and particularly, in a high-density storage element necessary to have a fine element diameter of equal to or smaller than 100 nm (which corresponds to the third plot from the right side of the sheet in the drawing), it is difficult to ignore a rise in resistance caused by erosion from the outer circumference portion to the magnetic layer.

For the above circumstance, it is sensible to seek a measure of estimating an amount of erosion caused by corrosion in advance and expanding the element area during microfabrication of the storage element.

However, the measure diminishes the merit of a vertical magnetization type ST-MRAM, which is of making a fine element.

[2-2. Configuration of Storage Element of Embodiment]

In the present embodiment, a configuration of the storage element 3 is configured as below.

First, the composition of the storage layer 17 of the storage element 3 is adjusted also in the embodiment, particularly, so that the size of the effective demagnetizing field that the storage layer 17 receives is smaller than the saturated magnetization amount Ms of the storage layer. In other words, in the same manner as in above-described Precedent Examples 1 and 2, a composition of the CoFeB alloy as the ferromagnetic material of the storage layer is selected to make the effective demagnetizing field that the storage layer receives be smaller than the saturated magnetization amount Ms of the storage layer 17. Accordingly, the magnetization of the storage layer 17 faces the film surface vertical direction.

Then, in the embodiment, an anti-corrosive material is added to the base material of the ferromagnetic layer included in the storage layer 17, that is, the above-described CoFeB alloy.

As the anti-corrosive material, valve metals, for example, Cr, Ti, Ta, or the like can be exemplified.

Herein, as an element to be added to obtain anti-corrosion in the embodiment, an element which can obtain an oxidization-suppressing effect of a CoFeB layer and can maintain characteristics of the storage layer in precedent examples may be possible. To specifically exemplify, beginning from Cr, Ti, and Ta as described above, for example, Ag, Cu, Au, Al, Si, Bi, B, C, O, N, Pd, Pt, Zr, Hf, Ir, W, Mo, Nb, or the like can be exemplified. When a non-magnetic element is added, the magnetic characteristic of the ferromagnetic layer is adjusted according to the addition amount.

In addition, as the magnetic element, Ni also satisfies the above condition.

Furthermore, to explain for the purposes of verification, configurations other than the storage layer 17 in a storage element 1 of the embodiment are the same as those in Precedent Examples 1 and 2. In addition, the configuration of the memory device is the same as that in Precedent Examples 1 and 2.

According to the configuration of the storage element according to the embodiment described above, it is possible to effectively suppress oxidization resulting from heat treatment of the ferromagnetic layer included in the storage layer 17 and an increase in RA. In addition, in parallel, it is possible to suppress an increase in RA also in high-heat treatment of which temperature is equal to or higher than 350° C. (refer to an experiment result below).

By suppressing RA after heat treatment, it is possible to realize an ST-MRAM with low power consumption.

In addition, as clear from the experiment result below, it is possible to intend improvement of thermal stability in the storage layer of the embodiment, in comparison to that in precedent examples.

In addition, according to the embodiment, there is no necessity of taking a measure of estimating an amount of erosion caused by corrosion in advance and expanding the element area, and in that sense, it is advantageous also in terms of miniaturization of the element size.

[2-3. Experiment of Storage Element of Embodiment]

Experiment 7

Experiment 7 is investigation of a characteristic when an anti-corrosive element is added to the storage layer as the precedent example. The saturated magnetization amount Ms of the storage layer shows the same value by a magnetization curve obtained by measurement with VSM. Three kinds of Samples 1 to 3 were prepared. A sample 1 is for comparison.

The structure of storage layer of each sample is as below.

Sample 1: A $[Co_{10}Fe_{90}]_{80}B_{20}$ film with a film thickness of 1.7 nm

Sample 2: A laminated film having a $[Co_{10}Fe_{90}]_{80}B_{20}$ film with a film thickness of 0.9 nm, a Cr layer of a film thickness of 0.2 nm, and a $[Co_{10}Fe_{90}]_{80}B_{20}$ film with a film thickness of 0.9 nm Sample 3: A laminated film having a $[Co_{10}Fe_{90}]_{80}B_{20}$ film with a film thickness of 0.8 nm, a Ni layer of a film thickness of 0.1 nm, and a $[Co_{10}Fe_{90}]_{80}B_{20}$ film with a film thickness of 0.8 nm In addition, the structure of each layer other than the storage layer is as below in all samples.

Foundation layer: A laminated layer having a Ta film with a film thickness of 10 nm, an Ru film with a film thickness of 10 nm, and a Ta film with a film thickness of 5 nm Magnetization fixed layer: A $[Co_{20}Fe_{80}]_{80}B_{20}$ film with a film thickness of 1 nm Tunnel insulating layer: A magnesium oxide film with a film thickness of 1 nm Cap layer: A laminated layer having a Ta film with a film thickness of 1 nm, an Ru film with a film thickness of 5 nm, and a Ta film with a film thickness of 3 nm Herein, for each sample, a thermally-oxidized film with a thickness of 300 nm was formed on a silicon substrate with a thickness of 0.725 mm and a storage element having the structure described above was formed thereon. In addition, a Cu film with a film thickness of 100 nm (which will serve as a word line to be described later) was provided between the foundation layer and the silicon substrate.

Each layer other than the insulating layer formed of a magnesium oxide film was formed using the DC magnetron sputtering method. The insulating layer formed of the magnesium oxide (MgO) film was formed using the RF magnetron sputtering method. Furthermore, after forming each layer of the storage element, heat treatment was performed for one hour at a temperature of 300° C. to 350° C. in a heat treatment furnace in the magnetic field.

Next, after the word line portion was masked by photolithography, a word line (lower electrode) was formed by performing selection etching with Ar plasma for the laminated films in a portion other than the word line. At that time, etching was performed for the portion other than the word line portion to a depth of 5 nm of the substrate. After that, a mask of the pattern of the storage element was formed by an electron-beam printing device, and selection etching was performed for the laminated films to form the storage element. Etching was performed right above the Cu layer of the word line in the portion other than the storage element. Furthermore, since it is necessary to make a sufficient current flow in the storage element in order to generate spin torque necessary for magnetization reversal of the storage element for characteristics evaluation, it is necessary to suppress a resistance value of the tunnel insulating layer. Thus, the pattern of the storage element was formed in a circular shape changing the diameter from 70 to 140 nm, and the tunnel insulating layer was adjusted so as to set an area resistance value ($\Omega\mu m^2$) of the storage element to 20 $\Omega\mu m^2$.

Next, the portion other than the storage element was insulated by sputtering of $Al_2O_3$ with a thickness of about 100 nm. After that, a bit line serving as an upper electrode and a pad for measurement were formed using photolithography. As such, a sample of the storage element was prepared.

For each sample of the storage element prepared as described above, characteristics evaluation was performed as below. Prior to measurement, it was configured to apply a magnetic field to the storage element from outside so as to enable control of values of the positive direction and the negative direction of a reversal current to be symmetric. In addition, voltage applied to the storage element was set to be 1V within a range where the insulating layer is not broken.

(Measurement of Magnetization Curve)

A magnetization curve of each sample was measured by VSM measurement. At this time, an element that has undergone microfabrication was not used for the measurement, and a bulk film portion of about 8 mm×8 mm specially provided for magnetization curve evaluation on a wafer was used. In addition, a magnetic field for measurement was applied to the film surface vertical direction.

(Measurement of Magneto-resistance Curve)

Evaluation was performed by measuring element resistance while applying a magnetic field to the storage element.

(Measurement of Reversal Current Value and Thermal Stability)

A reversal current value was measured for the purpose of evaluating a writing characteristic of the storage element of the embodiment. A current having a pulse width from 10 µs to 100 ms was made to flow in the storage element, and then a resistance value of the storage element was measured.

Furthermore, by changing an amount of the current flowing in the storage element, a current value reversing the direction of magnetization of the storage layer of the storage element was obtained. A value obtained by extrapolating pulse width dependency of the current value on 1 ns of a pulse width was set to a reversal current value. In addition, the inclination of pulse width dependency of the reversal current value corresponds to an index ($\Delta$) of the above-described thermal stability of the storage element. This means that the reversal current value becomes strong for disturbance of heat to the extent that the value does not change (the inclination is small) by a pulse width.

In addition, for the consideration of unevenness in storage elements, about 20 storage elements having the same structure were prepared, and measurement as above was performed to obtain an average value of reversal current values and the indices $\Delta$ of thermal stability.

Figure 11:
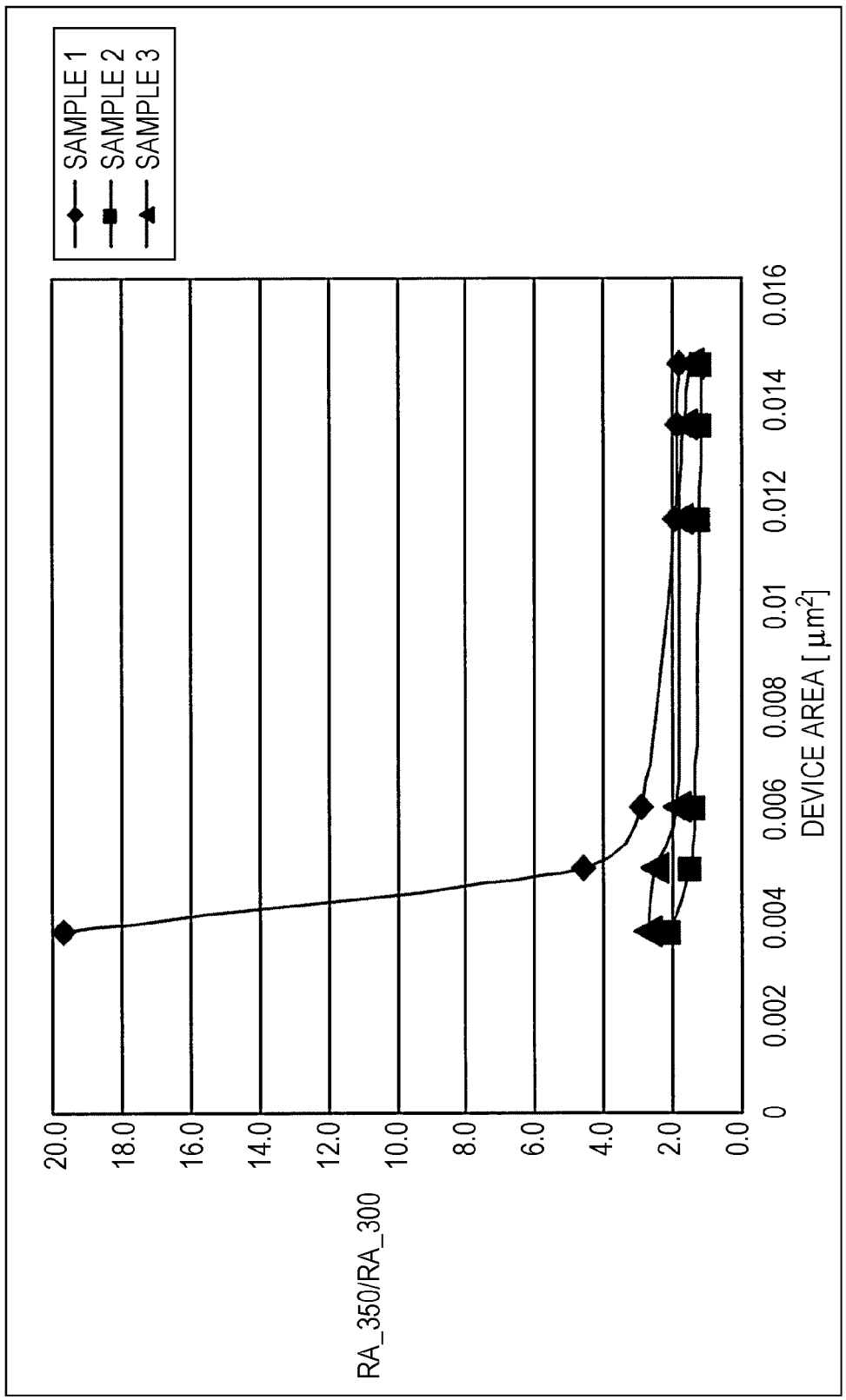
FIG. 11 is a diagram showing the RA ratio of heat-treatment temperatures of 300° C. and 350° C. for element sizes of samples 1 to 3.

FIG. 11 is a diagram showing the RA ratio of heat treatment temperatures of 300° C. and 350° C. for element sizes of each of the samples 1 to 3.

Furthermore, also in FIG. 11, the horizontal axis represents an element area ($\mu m^2$), and the vertical axis represents a ratio of RA when heat treatment was performed at 350° C. to RA when heat treatment was performed at 300° C. and (RA_350/RA_300), as in FIG. 10.

According to FIG. 11, it is found that a rise in heat treatment temperature and a rise in an RA value for extension of the element size were suppressed in storage elements (samples 2 and 3) to which the elements of the embodiment were added to the contrary of the comparison example (sample 1). This tells that Cr and Ni, which are added elements, have excellent anti-corrosion property, and the effect brought by alloying the elements with the CoFeB layer was reflected thereto.

In the next Table 6, saturated magnetization of the storage layers, MR ratios, and indices of thermal stability of the storage elements for Samples 1 to 3 are summarized.

TABLE 6

|  | Saturated Magnetization Ms [emu/cc] | MR Ratio [%] | Index of Thermal Stability |
|---|---|---|---|
| Sample 1 | 670 | 62 | 40 |
| Sample 2 | 610 | 81 | 56 |
| Sample 3 | 650 | 69 | 49 |

According to Table 6, it is found that samples 2 and 3, to which the anti-corrosive elements are added while showing the same level of saturated magnetization, showed high MR ratios. This is because a characteristic of the samples as a spin filter has been improved with a thicker film thickness of the storage layer of the embodiment even as the saturated magnetization, that is, demagnetizing field of the in-plane direction is being suppressed to the same degree.

The expansion of the volume of the storage layer contributed to the improvement of thermal stability.

Furthermore, in the experiment, a composition corresponding to that of Precedent Example 1 was used as a CoFeB layer (particularly, $0<B_z\leq30$ for B), but the same result as above is obtained also in the ferromagnetic layer having the CoFeB layer of Precedent Example 2 (particularly, $20<B_z\leq40$ for B) as the base material.

<3. Modified Example>

Hereinabove, the embodiment has been described, but the disclosure is not limited to the film configuration of the storage element shown in the above-described embodiment, and various film configurations can be employed.

For example, in the embodiment of the present disclosure, the composition of CoFeB of the storage layer 17 and the magnetization fixed layer 15 are set to be the same, but it is not limited to the above-described embodiment, and other various configurations can be taken in a range not departing from the gist of the disclosure.

In addition, in the embodiment of the present disclosure, only a single foundation layer 14, a cap material, and shape of the storage element is shown, but it is not limited thereto, and other various configurations can be taken in a range not departing from the gist of the disclosure.

In addition, in the embodiment of the present disclosure, the magnetization fixed layer 15 is a single layer, but a laminated ferri-pin structure formed of two layers of a ferromagnetic layer and a non-magnetic layer may also be used. Furthermore, a structure in which an anti-ferromagnetic film is rendered to the laminated ferri-pin-structured film may also be possible.

In addition, it does not matter at all whether a film structure of the storage element has a structure in which the storage layer 17 is disposed above the magnetization fixed layer 15, or disposed below the layer. Furthermore, it does not matter at all whether the film structure is a so-called dual structure in which the magnetization fixed layer 15 and the storage layer 17 are present above and below.

The present disclosure contains subject matter related to that disclosed in Japanese Priority Patent Application JP 2011-007666 filed in the Japan Patent Office on Jan. 18, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage element comprising:
   a storage layer which has magnetization vertical to a film surface and of which the direction of magnetization changes corresponding to information;
   a magnetization fixed layer which has magnetization vertical to the film surface serving as a reference of information stored in the storage layer; and
   an insulating layer as a non-magnetic body which is provided between the storage layer and the magnetization fixed layer
   wherein the direction of magnetization of the storage layer changes by injecting spin-polarized electrons in the laminated direction of the layer structure having the storage layer, the insulating layer, and the magnetization fixed layer and then recording of information is performed on the storage layer,
   wherein the size of an effective demagnetizing field that the storage layer receives is configured to be smaller than a saturated magnetization amount of the storage layer, and
   wherein a ferromagnetic layer material constituting the storage layer has CoFeB as the base material and an anti-corrosive element is added to the base material.

2. The storage element according to claim 1, wherein the anti-corrosive element is a valve metal.

3. The storage element according to claim 2, wherein the anti-corrosive element is chromium (Cr) or nickel (Ni).

4. The storage element according to claim 1, wherein the anti-corrosive element is any one selected from a group consisting of Ag, Cu, Au, Al, Si, Bi, Ta, Ti, B, C, O, N, Pd, Pt, Zr, Hf, Ir, W, Mo, and Nb.

5. The storage element according to claim 1, wherein the composition of the CoFeB is set to $(Co_xFe_y)_{100-z}B_z$ in the ranges of:
   $0\leq Co_x\leq40$;
   $60\leq Fe_y\leq100$; and
   $0<B_z\leq30$.

6. The storage element according to claim 1, wherein the composition of the CoFeB is set to $(Co_xFe_y)_{100-z}B_z$ in the ranges of:
   $0\leq Co_x\leq40$;
   $60\leq Fe_y\leq100$; and
   $20<B_z\leq40$.

7. A memory device comprising:
   a storage element which holds information by a magnetization state of a magnetic body; and
   two kinds of lines which intersect with each other,
   wherein the storage element includes a storage layer which has magnetization vertical to a film surface and of which the direction of magnetization changes corresponding to information, a magnetization fixed layer which has magnetization vertical to the film surface serving as a reference of information stored in the storage layer, and an insulating layer as a non-magnetic body which is provided between the storage layer and the magnetization fixed layer, in which the direction of magnetization of the storage layer changes by injecting spin-polarized electrons in the laminated direction of the layer structure having the storage layer, the insulating layer, and the magnetization fixed layer and then recording of information is performed on the storage layer, the size of an effective demagnetizing field that the storage layer receives is configured to be smaller than a saturated magnetization amount of the storage layer, and a ferromagnetic layer material constituting the storage layer has CoFeB as the base material and an anti-corrosive element is added to the base material, wherein the storage element is disposed between the two kinds of lines, and wherein a current is made to flow in the storage element in the laminated direction through the two kinds of lines to perform injection of spin-polarized electrons.

* * * * *